(12) United States Patent
Ruiz Diaz et al.

(10) Patent No.: US 12,009,447 B2
(45) Date of Patent: Jun. 11, 2024

(54) SYSTEMS FOR RADIATIVE POWER CONCENTRATION

(71) Applicant: Arizona Board of Regents on Behalf of the University of Arizona, Tucson, AZ (US)

(72) Inventors: Liliana Ruiz Diaz, Tucson, AZ (US); Sifang Cui, Tucson, AZ (US); Robert Norwood, Tucson, AZ (US); Kyung-Jo Kim, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 420 days.

(21) Appl. No.: 17/290,695

(22) PCT Filed: Nov. 1, 2019

(86) PCT No.: PCT/US2019/059342
§ 371 (c)(1),
(2) Date: Apr. 30, 2021

(87) PCT Pub. No.: WO2020/092876
PCT Pub. Date: May 7, 2020

(65) Prior Publication Data
US 2022/0029039 A1 Jan. 27, 2022

Related U.S. Application Data

(60) Provisional application No. 62/755,008, filed on Nov. 2, 2018, provisional application No. 62/754,887, filed on Nov. 2, 2018.

(51) Int. Cl.
*H01L 31/054* (2014.01)
*G02B 19/00* (2006.01)

(52) U.S. Cl.
CPC ...... *H01L 31/0543* (2014.12); *G02B 19/0042* (2013.01); *H01L 31/0547* (2014.12)

(58) Field of Classification Search
CPC .......... H01L 31/0232; H01L 31/02327; H01L 31/054; H01L 31/0543; H01L 31/0547; G02B 19/0042; G02B 19/00
See application file for complete search history.

(56) References Cited

U.S. PATENT DOCUMENTS

| | | | |
|---|---|---|---|
| 2011/0297229 A1* | 12/2011 | Gu ................ | H01L 31/0547 264/1.24 |
| 2016/0027943 A1* | 1/2016 | Bracamonte ...... | H01L 31/0547 136/246 |
| 2017/0098729 A1* | 4/2017 | Fisher ............. | G02B 19/0014 |

FOREIGN PATENT DOCUMENTS

WO WO-2012169980 A1 * 12/2012 .............. F24J 2/06

* cited by examiner

*Primary Examiner* — Mayla Gonzalez Ramos
(74) *Attorney, Agent, or Firm* — Quarles & Brady LLP; Yakov S. Sidorin

(57) ABSTRACT

Linear acylindrical lens (and array/system employing a plurality of such lens elements) containing liquid silicone rubber material for use in solar applications, as well as a low-cost silicone based optical lightguide(s) configured to channel and concentrate solar light with about 90% optical efficiency. The lens includes a transparent glass substrate (with an optional coating), which mechanically supports a moldable flexible silicone lenslet optical quality and is bonded to it with the use of plasma and in absence of adhesive material. When injection molding of lightguide(s) is employed, the lightguide shape can be formed variably to provide for integration of multiple lightguide s into an array with alignment tolerances that are looser than in a solar concentrator employing glass waveguides. Optical system employing such (arrayed) linear lens(es) concatenated with corresponding (arrayed) lightguides, juxtaposed with micro-CPV cells and conventional PV-cell(s) to capture diffused light.

13 Claims, 21 Drawing Sheets

| Coefficient | Value |
|---|---|
| 4th order Aspheric | 0.00000 |
| 6th order Aspheric | 0.00000 |
| 8th order Aspheric | 0.00000 |
| 10th order Aspheric | 0.00000 |
| 12th order Aspheric | 0.00000 |
| 14th order Aspheric | 0.00000 |
| 16th order Aspheric | 0.00000 |
| 18th order Aspheric | 0.00000 |
| 20th order Aspheric | |
| End of Data | |

Shape [X Toroid ▾]

☑ Calculate Inner Diameter

Inner Diameter [82.462]

Conic Constant [-1.8880]

Radius [13.718]

Concavity
● Convex
○ Concave

Swept Radius [0.00000]

Swept Concavity
● Convex
○ Concave

FIG. 1D

○ Circular

Diameter [      ] mm

● Rectangular

Height [80.000] mm

Width [20.000] mm

Thickness [5.3000] mm

Edge Thickness [2.0063] mm

Focal Length [32.959] mm

Front Focal Length [32.959] mm

Back Focal Length [29.217] mm

Front Principal Plane [0.00000] mm

Back Principal Plane [-3.7424] mm

FIG. 1C

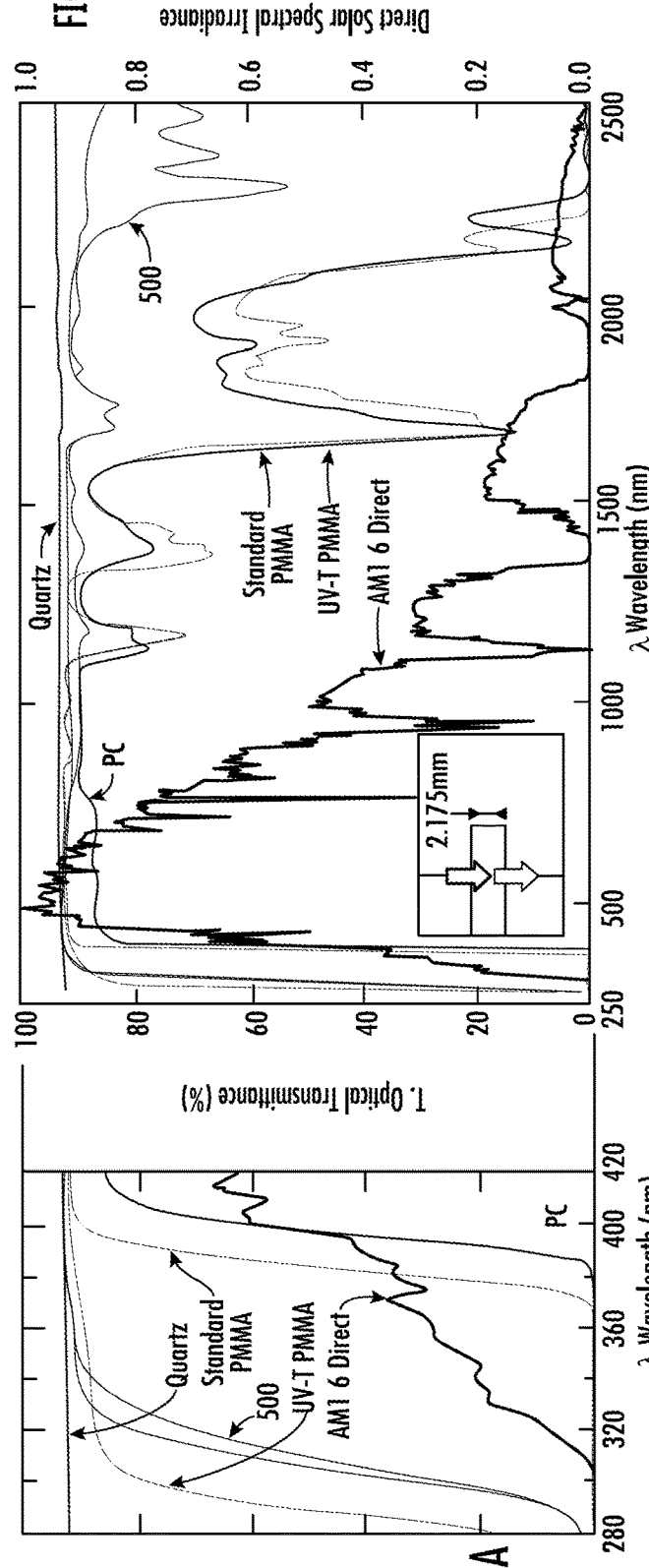
FIG. 4A
FIG. 4B
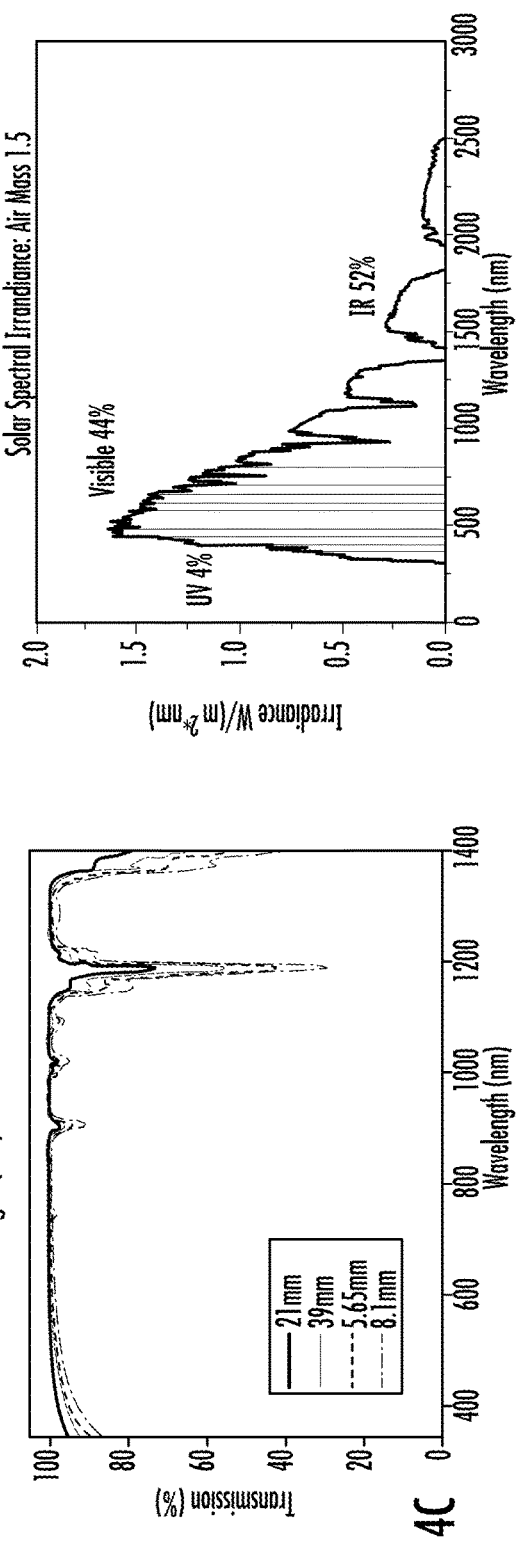
FIG. 4C
FIG. 4D

WING DESIGN

Schematic of Concentrating Wing Waveguide: a) side and b) top view

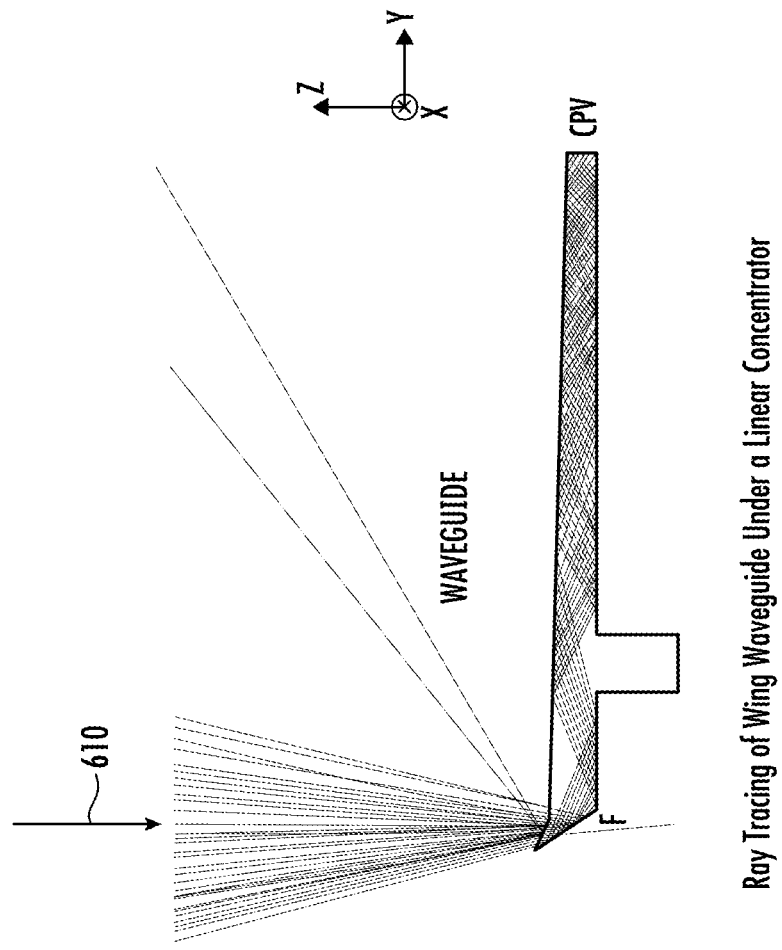

FIG. 6B
Ray Tracing of Wing Waveguide Under a Linear Concentrator

DETAILS ABOVE THE WING WAVEGUIDE

- Overall System's efficiency: 89.7%
- Geometrical Concentration: 181.6
- Optical Concentration: 163x
- Waveguide Efficiency: 93%
- Waveguide Length: 17.737 mm
- Waveguide Width: 4.45 mm
- Distance Top Lens to Bottom waveguide: 38.0 mm
- Waveguide Outlet Size: 0.7x0.7mm
- No ARC or Reflective Coating on waveguideMS1002 Lens With Glass slab on Top
- Index Matched CPV
- Foot: Height=2.5mm, Width=4mm, Length=1.5mm The output size of the wing waveguide can be changed for different CPV cell dimensions. Smaller output sizes allow for smaller solar cell dimensions, which increases optical concentration but also reduces optical efficiency.

SOLAR TRACKING TOLERANCES

Light-guide design: a) Light-guide sketch and b) solar tracking directions

SOLAR TRACKING TOLERANCES

Light-guide design: c) tolerances for solar tracking in two directions. Waveguide has high angle tolerance in Beta direction (±8°). This is due to large CPC acceptance angle (7.9°). In the alpha direction, the waveguide design has smaller tolerance (0.3° vs. 0.5°) than a single lens design.

An example of solar tracking by a single spherical lens. The tracking tolerances are very constrained in both directions.

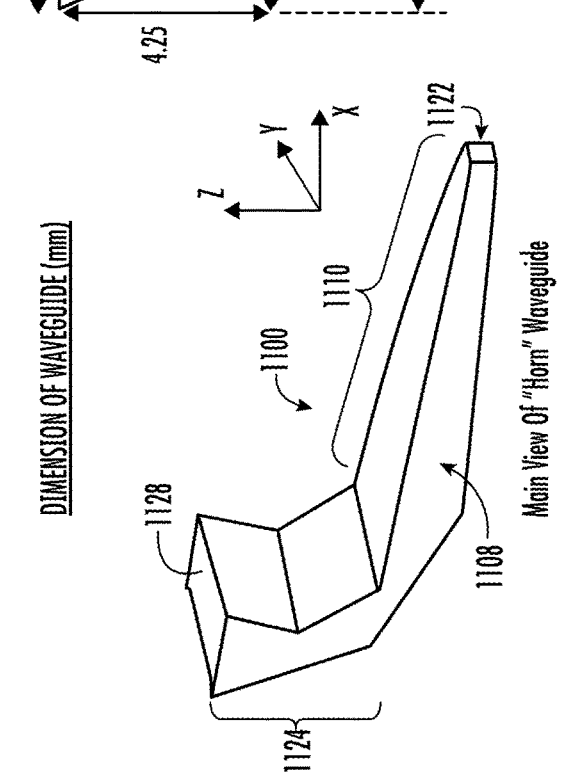
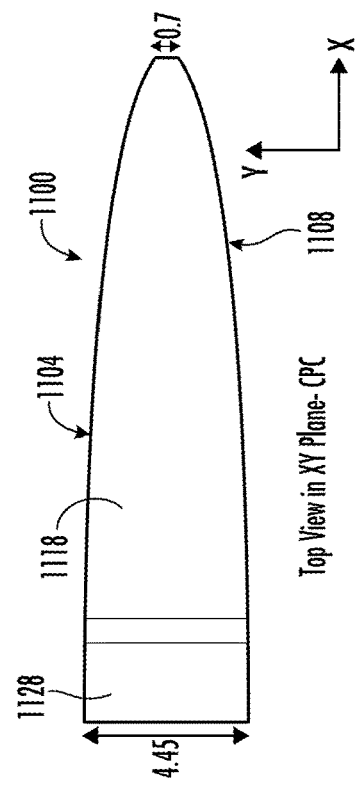
FIG. 11A
FIG. 11B
FIG. 11C
FIG. 11D

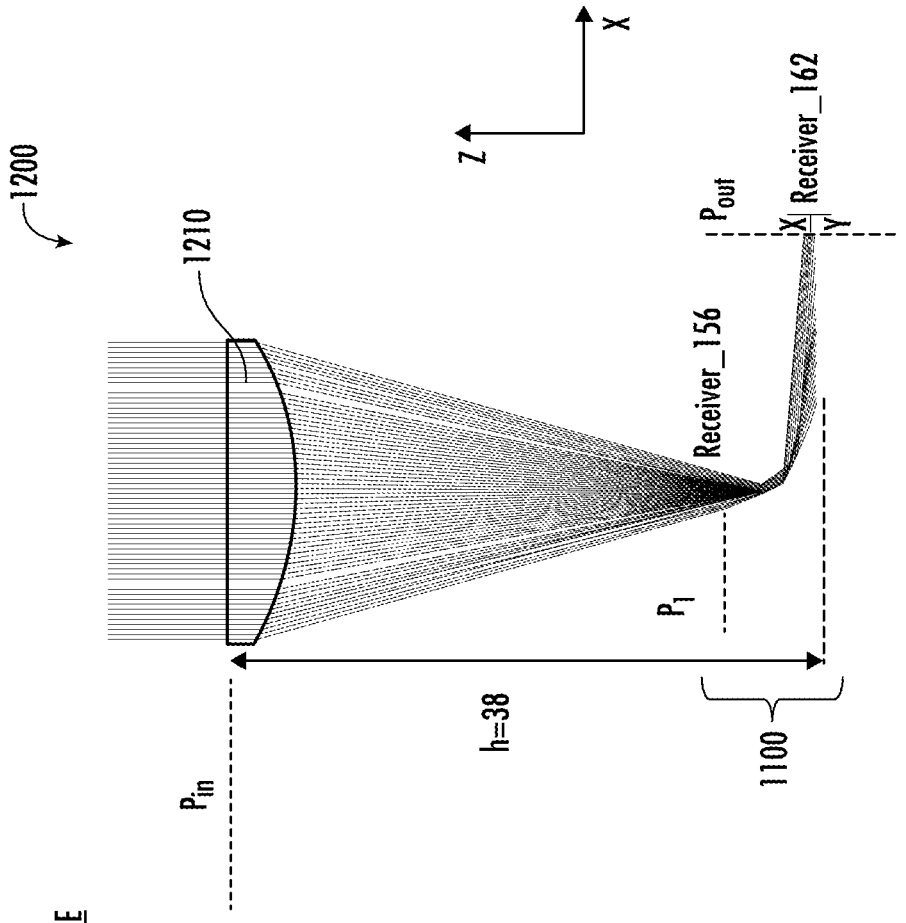

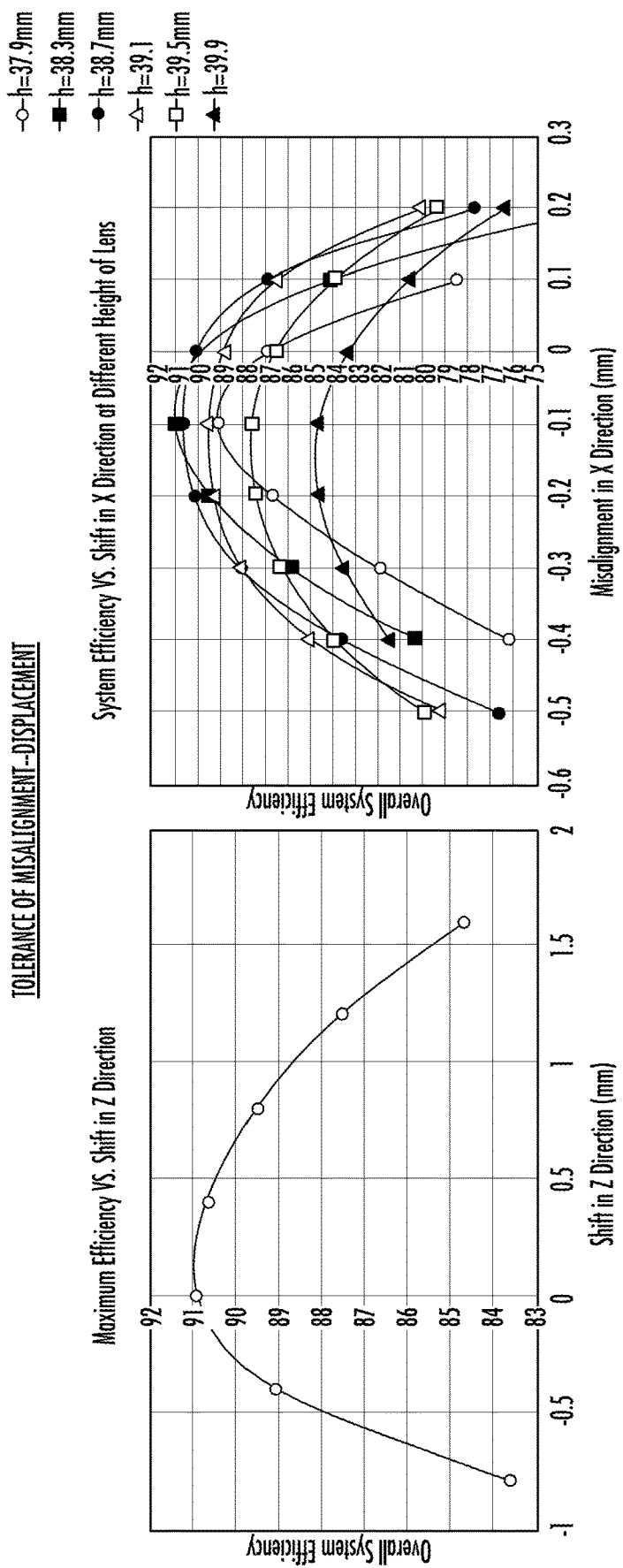
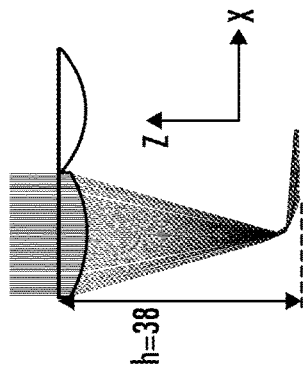
FIG. 13A
FIG. 13B

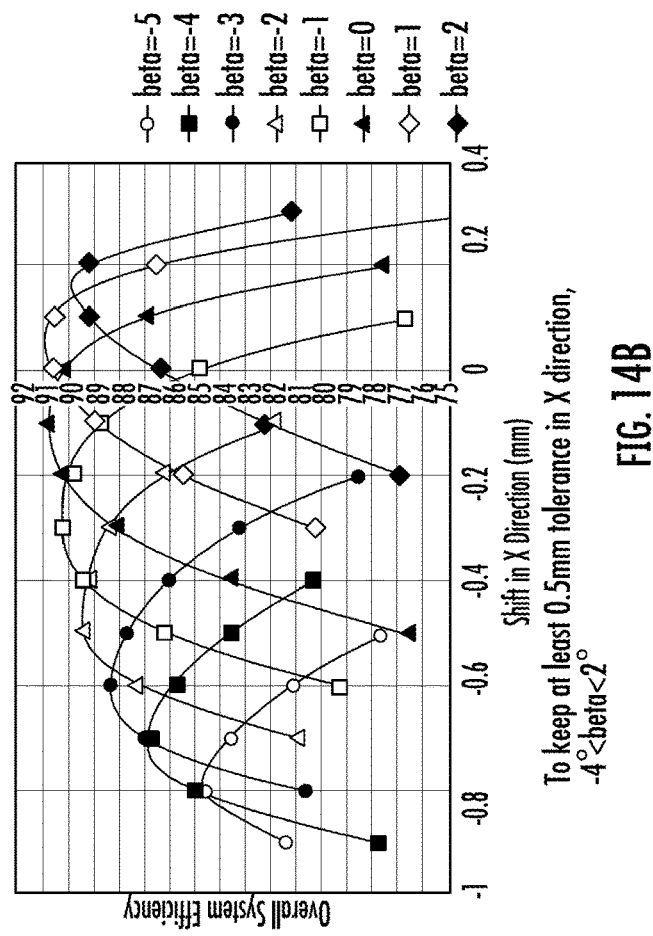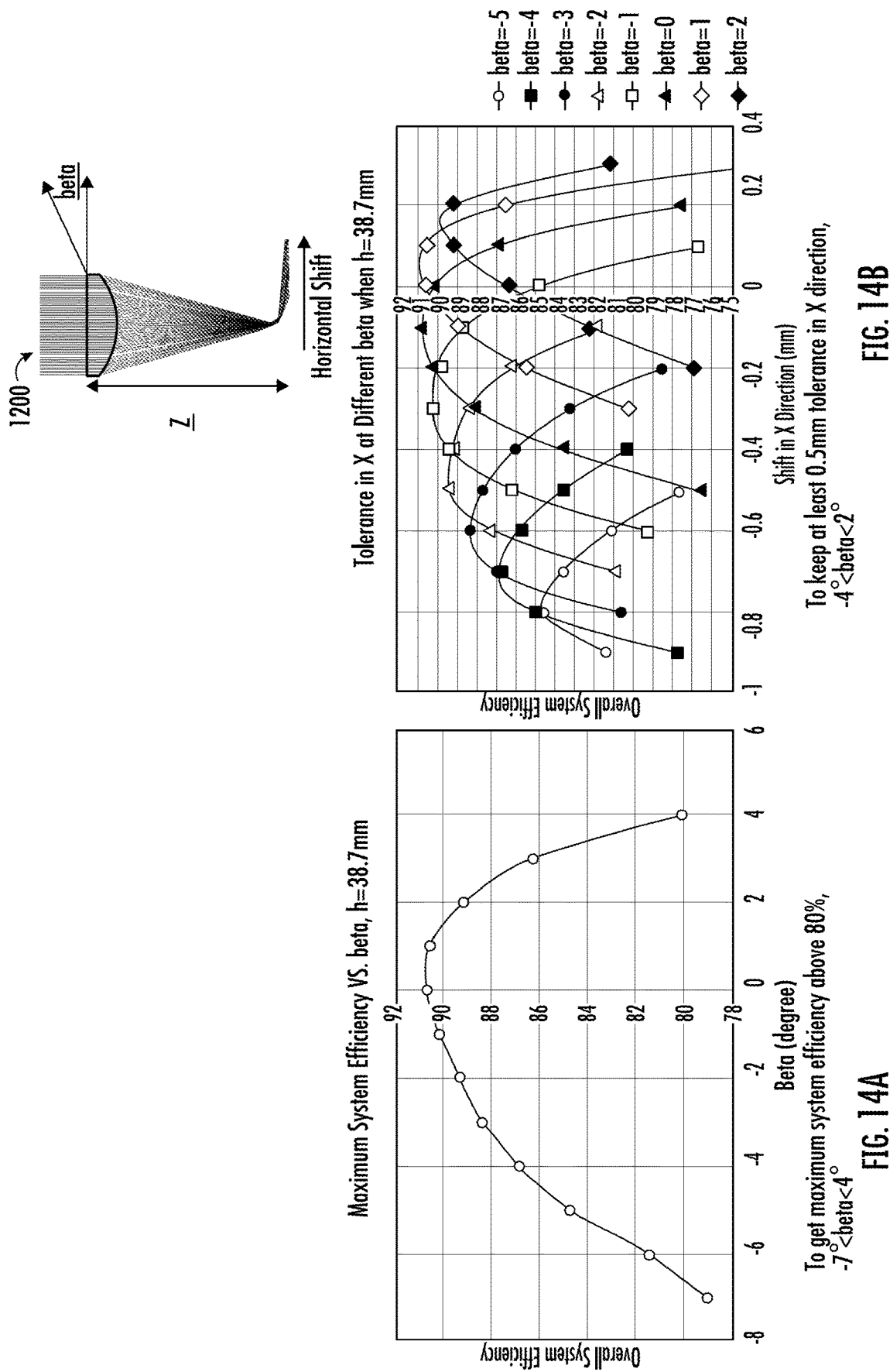
FIG. 14A
FIG. 14B

FLEXIBLE MOLDABILITY
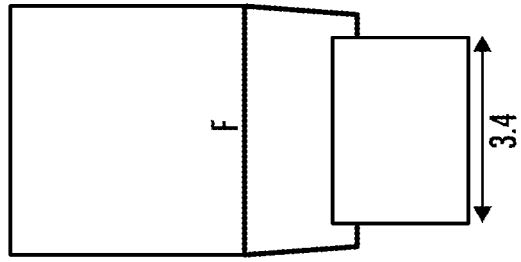
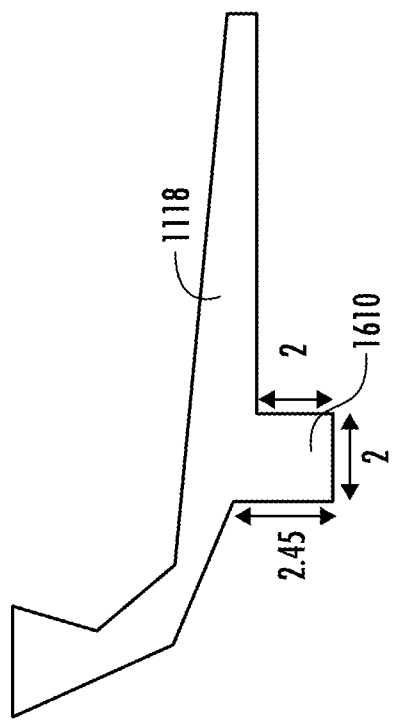
FIG. 16A
With "Foot" to support the waveguide in practical assembly. Overall system efficiency is 90%
FIG. 16B

SUMMARY

| Overall System Efficiency | Waveguide Efficiency | Overall System Efficiency with 1mm Support | Tolerance in Z (mm) | Tolerance in X (mm) | Tolerance of Beta | Tolerance of Tracker |
|---|---|---|---|---|---|---|
| 91% | 95% | 89% | 2 | 0.5 | -7°<beta<4° | -0.5°<beta<0.45° |
| | | | 0.8 | 0.7 | | |

FIG. 17

SYSTEMS FOR RADIATIVE POWER CONCENTRATION

CROSS-REFERENCE TO RELATED APPLICATIONS

This US Patent Application is a national phase from the International Patent Application No. PCT/US2019/059342 filed on Nov. 1, 2019 and now published as WO 2020/092876, which claims priority from and benefit of the U.S. Provisional Patent Applications No. 62/754,887 filed on Nov. 2, 2019 and No. 62/755,008 filed on Nov. 2, 2019. The disclosure of each of the above-identified patent applications is incorporated herein by reference.

TECHNICAL FIELD

The invention relates generally to the field of solar-power conversion and, in particular, to the optical systems configured to increase a degree of concentration of solar power delivered to a photovoltaic cell, and related methodologies.

RELATED ART

As the global interest in renewable and clean energy continues to grow, research on solar power generation is accelerating. One of the beneficial outcomes from it is the fact that, by now, the photoelectric conversion efficiency of the so-called concentrated photovoltaic (CPV) technology can reach more than 40%, as long as the area of the employed photovoltaic (PV) cell(s) utilized for that purpose can be limited through the process of high (geometric) concentration (for example, up to 200×).

In particular, for successful implementation of these CPV solar applications, highly concentrating optics are required to collect sunlight for single-axis, dual-axis, or non-tracking applications. Some approaches for increasing sunlight concentration efficiencies already exist—such as mirror-based concentrators, Fresnel lenses, and optical glass lenses, for example. However, practical implementation of these solutions continues to present challenges for mass production due to high installation cost, low (insufficient) optical performance, and manufacturing difficulties. While research in the field of making optical concentration based on polymer materials concentrators has been pursued to overcome at least some of these challenges, the most commonly-used optical polymer materials have high absorbance in the UV and NIR solar spectrum, which limits their practical applicability.

At the same time, waveguides and/or lightguides and/or lightpipes are often used in various solar applications to redirect and spatially concentrate the sunlight onto a PV-cell (while a person of skill readily appreciates an optical wave-propagation-based differentiation among the structures referred to as waveguide, lightguide, and lightpipe, each of these otherwise light-channeling constructs will be referred to in this disclosure as a lightguide, for simplicity of presentation). To achieve a high level of spatial concentration of light as well as efficiency of operation, lightguides made of glass materials can be utilized. Such a solution, however, can be expensive and very involved, at least from the fabrication point of view: indeed, fabrication from glass of lightguides possessing small geometrical features is rather complicated, and each individual lightguide may require separate fine polishing (which further increases the cost of mass production). In addition, considering the constraints imposed by the often rather unexpected shape of custom glass lightguides, the process of assembly of a plurality of glass-based lightguides into a full multi-lightguide system becomes very tedious and complicated. While the use of polymetric materials (such as polymethylmethacrylate, PMMA, or polycarbonate, PC), for example, for fabrication of lightguides for solar applications can potentially address some of these issues, the level of absorbance of these materials in the UV and NIR regions of the solar spectrum is relatively high, as was already alluded to above. This, understandably, causes photo-induced changes in optical characteristics of these materials upon long-term exposure to the sunlight as well as poor optical transmittance of the lightguides, which detrimentally affects collection of the sunlight.

Below are presented solutions—from design to fabrication of a silicone-based linear lens array, a single lenslet of substantially any shape (and the array of such lenslets), low-cost silicone-based optical lightguides configured to channel the sunlight, and systems employing a combination of these optical constructs—to obtain a high-efficiency and low-cost solar concentrator.

SUMMARY

Embodiments of the invention address problems accompanying the use of currently-known (solar) radiation concentrators by employing at least one of the specifically-configured acylindrical lens(es) (and/or arrays of such lenses) and/or judiciously-shaped radiation guide(s) (lightguide(s)) to enhance radiation throughput through the resulting concentrator and to achieve high concentration ratios while satisfying tight spatial constraints and the need to utilize micro-sized PV-cells.

Accordingly, embodiments of the invention provide a lens system that includes a first linear lens element (made of a first material and having a first optical axis and first and second surfaces transverse to the first optical axis) and an optically-transparent substrate that is made of a second material, that has a substantially zero optical power, and that is affixed to the first surface to form a first interface between the substrate and the first lens element. In one case, the substrate is dimensioned as a plane-parallel optical plate, and the interface does not include an adhesive material. The curved surface of the lens element may be dimensioned as an acylindrical surface. In any implementation, the lens system may additionally include a second linear lens element made of the first material and having a second optical axis and third and fourth surfaces transverse to the second optical axis. (When this is the case, the substrate may be is affixed to the third surface to form a second interface between the substrate and the second lens element such that the second interface is devoid of the adhesive material. Alternatively or in addition, the first and second optical axes may be not parallel to one another. Moreover, at least one of the second and fourth surfaces may be an acylindrical optical surface). In any embodiment of the lens system, one or more of lens elements of the system is characterized by transmittance in excess of 85% at every wavelength in a spectral region between 350 nm and 1100 nm. (In a specific case, however, one or more of the lens elements is characterized by a transmittance value in excess of 92% at every wavelength in a spectral region between 350 and 1100 nm, and by a second transmittance in excess of 50% at every wavelength between 350 nm and 1400 nm.) In one embodiment of the lens system, at least one of the following conditions is satisfied: a) the lens system includes an array of the first linear lens elements affixed to the substrate, and such array is configured to form to converge a substantially plane optical wavefront, incident directly onto a surface of the substrate, to a plurality of substantially-parallel focal lines, and b) the substrate is dimensioned as either a wedge or as a plane-parallel plate. (In such embodiment, alternatively or in addition, lines from said plurality of lines either may not be equally spaced from one another or may be located at different distances from said surface of the substrate.)

Embodiments also provide a method for fabricating a lens system, which includes the steps of molding a first lens element; exposing a first surface of the first lens element and a first surface of an optically-transparent substrate to plasma to form a plasma-treated first surface of the first lens element and a plasma-treated first surface of the substrate; and applying pressure to a combination of the first lens element and the substrate while the plasma-treated first surface of the first lens element and the plasma-treated first surface of the substrate are in contact with one another to form a temporally-stable bond between said first surfaces in absence of an adhesive between the first surface of the first lens element and the first surface of the substrate. In one case, a) the step of molding includes molding the lens element to form a lens element with transmittance value in excess of 85% at every wavelength in a spectral region between 350 nm and 1100 nm and/or b) the step of exposing may include exposing two substantially planar surfaces to plasma.

The method may further include the steps of molding a second lens element to form an array of the first and second lens elements; exposing a first surface of the second lens element to plasma to form a plasma-treated first surface of the second lens element, and forming a temporally-stable bond between the first plasma-treated surface of the second lens element and the plasma-treated first surface of the substrate in absence of an adhesive between said first plasma-treated surface of the second lens element and the plasma-treated first surface of the substrate as a result of applying pressure to one of the second lens element and the substrate. In any implementation, a surface of the substrate may be anti-reflection coated and/or the process of fabricating the lens system may include mechanically-supporting at least one lens element of the lens system with this substrate (under a condition that rigidity of such lens element of the lens system is lower than rigidity of the substrate). In substantially any embodiment, at least one of the process of molding the first lens element and the process of molding the second lens element may include molding of a lens element that has a positive optical power. Furthermore, the process of exposing may include forming the plasma-treated first surface of the plane-parallel optical substrate.

Embodiments of the invention additionally provide a method for forming a radiation concentrator configured as an optical system. Such method includes the steps of molding a lightguide element having a spatially-tapered body and an input facet that is transverse to an axis of the body; molding a first lens element; exposing a first surface of the first lens element and a first surface of an optically-transparent substrate to plasma to form a plasma-treated first surface of the first lens element and a plasma-treated first surface of the substrate; applying pressure to a first combination of the first lens element and the substrate while the plasma-treated first surface of the first lens element and the plasma-treated first surface of the substrate are in contact with one another to form a temporally-stable bond between the involved first surfaces in absence of an adhesive between these first surfaces; and spatially configuring the lightguide element with the first combination such as to position the input facet substantially at a focal plane of the first lens element. The molding procedure of the method may include molding an optical element having transmittance in excess of 80% at every wavelength in a spectral region between 350 nm and 1100 nm, and/or the exposing procedure of the method may include exposing two substantially planar surfaces to plasma. The method may further include a step of molding a second lightguide element and a second lens element to form each of these elements, and forming a temporally-stable bond between a first plasma-treated surface of the second lens element and a first plasma-treated surface of the substrate in absence of an adhesive between these surfaces as a result of applying pressure to one of the second lens element and the substrate, to form an array of lens systems. In this case, the method further involves a step of spatially configuring the second lightguide element with the first lightguide element to form an array of lightguide elements, and spatially configuring the array of the lens systems with the array of the lightguides such that an input facet of each of the first and second lightguides is disposed substantially at a focal plane of a corresponding one from the first and second lens elements. In any implementation, a surface of the substrate may be anti-reflection coated and/or the step of forming may include mechanically-supporting a lens element of the lens system with the substrate the rigidity of which is higher than the rigidity of the lens system. Alternatively or in addition, at least one of the molding of the first lens element and molding of the second lens element may include includes molding of a lens element having positive optical power, and/or the process of exposing may include forming the plasma-treated surface of the substrate while the substrate is a plane-parallel optical plate.

Embodiments further provide a radiation concentrator configured as a radiation guide (in one specific case—a lightguide). Such radiation concentrator includes a first radiation guide having input and output facets and a tapered body bound by a top surface, a bottom surface, and two wall surfaces. (Here, the body is dimensioned to reduce first and second spatial extents of a distribution of light when said light is channeled by the first radiation guide from the input facet to the output facet, where the first spatial extent and the second spatial extent are defined along mutually-transverse axes. Additionally, the input and output facets are transverse to one another, and the radiation guide has an auxiliary facet located to provide for a total internal reflection of entered light that has traversed the input facet and to redirect the entered light towards the output facet. Generally, the planes in which the input and output facets lie at not parallel to one another, and in a specific case when these planes are perpendicular to one another, the radiation guide may include a first portion (located between the input facet and the body) that has its optical axis that is perpendicular to the input facet. Such first portion has a cross-section that monotonically decreases with a distance measured along the optical axis of the first portion from the input facet, the first portion having two side walls each of which is transverse to the optical axis of the first portion. In any embodiment, such radiation guide has transmittance exceeding 80% substantially at each of wavelengths within the spectral range from about 350 nm to about 1100 nm, and exceeding 50% substantially at each of wavelengths within the spectral range from about 350 nm to about 1400 nm.

Embodiments of a method for concentrating optical power, according to the idea of the invention, include: a) at least partially transmitting sunlight incident on a plane-parallel optical plate, through interfaces between a first material of said plate and a second material of an array of lens elements, each lens element having a corresponding optical axis and transmittance in excess of 85% in a spectral region between 350 nm and 1100 nm (here, each of the interfaces is devoid of an adhesive material), and b) forming areas of illumination with the sunlight as a result of transferring the sunlight through bodies of individual lens elements of said array (here, the areas of illumination are dimensioned to define a plurality of substantially parallel lines of light). In one case, the step of forming may include forming the lines of light (from the plurality of substantially parallel lines of light) at different distances from one of the interfaces such that each of the lines of light represents a focus of a corresponding lens element from the array. Alternatively or in addition, the step of forming may include forming substantially parallel to one another lines of light that are spaced non-equidistantly from one another in a given plane. In substantially any case, the implementation of steps of at least partially transmitting and forming may involve passing the sunlight through the first material and the second material that are different from one another. Alternatively or in addition, the method may include a step of at least partially channeling light (from the plurality of substantially parallel lines of light) with a lightguide made of the second material towards a pre-defined surface while, at the same time, increasing irradiance of the sunlight upon propagation through the lightguide. In one embodiment of the method, at least one of the following conditions is satisfied: a) the method includes receiving, at the pre-defined surface, diffused sunlight that has not been channeled through the lightguide; and b) the lightguide is made of the second material.

Additionally a radiation concentrator system (or, radiation concentrator, for short) is provided, an embodiment of which includes a lens system and a first radiation guide. The lens system contains a first lens element (that is transparent to radiation and made of a first material and has a first axis and first and second surfaces transverse to the first axis) and a first substrate (that is transparent to radiation, made of a second material, and affixed to the first surface to form a first interface between the first substrate and the first lens element. The first radiation guide has input and output facets that are transverse to one another (with the input facet disposed to cross the first axis) and a tapered body bound by a top surface, a bottom surface, and two wall surfaces. Here, a separation between the two wall surfaces in a plane containing the bottom surface is monotonically increased as a function of distance from the output surface.

The body of the first radiation guide is dimensioned to reduce first and second spatial extents of a spatial distribution of radiation when the radiation is channeled by the first radiation guide from the input facet to the output facet (the first spatial extent and the second spatial extent are transverse to one another). The first radiation guide may include an auxiliary facet located to provide for a total internal reflection of radiation that has coupled to the first radiation guide through the input facet and to redirect the so-entered radiation towards the output facet. Alternatively or in addition, in substantially any implementation of the first radiation guide planes in which the input and output facet lie may be not perpendicular to one another. When such planes are perpendicular to each other, the first radiation guide may be structured to include a first portion between the input facet and the body. (Such first portion may have a first portion axis that is perpendicular to the input facet, and have a cross-section that monotonically decreases with a distance measured along the first portion axis from the input facet. In this case, the first portion has two side walls each of which is transverse to the first portion axis.

In any implementation of the radiation concentrator, the radiation may include light, and in this case the lens system is configured to have a first transmittance value exceeding 85% and the first radiation guide has a second transmittance value exceeding 80% substantially at each of wavelengths within a spectral range from about 350 nm to about 1400 nm. Alternatively or in addition, the lens system and the first radiation guide may be spatially configured such that the input facet is located substantially at a focal plane of the first lens element, and the bottom surface and the first substrate are substantially parallel to one another. In this latter case, the first lens element may be dimensioned as a linear acylindrical lens, while the first substrate has a substantially zero power, and the first interface does not include an adhesive material. Further more, at least one of the following conditions may be satisfied in an embodiment of the concentrator: a) the first substrate of the lens system is dimensioned as a plane-parallel plate or a wedge; b) the lens system comprises a second lens element made of the first material and having a second axis and third and fourth surfaces transverse to the second axis, as well as a second substrate that is transparent to the radiation and made of the second material and affixed to the third surface to form a second interface between the second substrate and the second lens element, while the radiation concentrator further includes a second radiation guide that is substantially identical to the first radiation guides and is spatially cooperated with the second lens such that an input facet of the second lightguide is located substantially at a focal plane of the second lens element, and a bottom surface of the second lightguide and the substrate are substantially parallel to one another; and c) a cross-sectional profile of at least one of the two walls in a plane transverse to these walls is substantially parabolic. (In one specific case, the second substrate is the first substrate is affixed to the third surface to form said second interface that is devoid of an adhesive material.) In substantially any embodiment of the radiation concentrator that includes first and second lens elements, the first and second axes may be not parallel to one another; and/or least one of the second and fourth surfaces may be curved with a radius that changes as a function of angle at which such surface is viewed from a center of curvature of the surface in a cross-sectional plane containing the radius.

Embodiments further provide a solar power converter that includes the radiation concentrator described above as well as a first photovoltaic cell dimensioned to substantially match an area of an output facet of any of the first and second radiation guides and cooperated with the output facet of at least one radiation guide to collect radiation emitted through such output facet. The solar power converter may additionally include a second photovoltaic cell disposed substantially parallel to the bottom surface of the first radiation guide and separated from the first lens element by the first radiation guide.

Embodiments additionally provide a method for use of a radiation concentrator described above, and including a step of transmitting radiation through a first substrate of a lens system, through an interface between the first substrate and a first lens element of the lens system, and through the first lens element to form spatially-converging radiation (here, the first lens element is made of a first material and the first substrate is made of a second material that is different from the first materials). The method also includes a step of receiving the spatially-converging radiation by a first radiation guide through an input facet to form coupled radiation inside the first radiation guide, and a step of channeling the coupled radiation inside the tapered body of the first radiation guide towards an output facet thereof to form an output radiation at the output facet (the output facet being transverse to the input facet). As mentioned above, the tapered body is bound by a top surface, a bottom surface, and two wall surfaces dimensioned such that a separation between the two wall surfaces in a plane substantially parallel to the bottom surface is monotonically increased as a function of a distance from the output surface. In one case, channeling includes forming a spatial distribution of the output radiation at the output facet with irradiance that is higher than an irradiance of the coupled radiation; and/or at least one of the following conditions is satisfied: a) the steps of transmitting includes transmitting radiation through the first substrate having a substantially zero power; b) the step of receiving includes receiving the spatially-converging radiation by the input facet that is substantially perpendicular to the output facet; c) the step of channeling includes channeling the coupled radiation through a first portion of the first radiation guide between the input facet and the tapered body (where the first portion has a first portion axis, two side walls each of which is transverse to the first portion axis, and a cross-section that monotonically decreases with a distance measured along an axis of the first portion from the input facet). If—in any of the embodiments—the radiation includes light, the lens system is configured to have a first transmittance value exceeding 85% and the first radiation guide is configured to have a second transmittance value exceeding 80% substantially at each of wavelengths within a spectral range from about 350 nm to about 1400 nm.

Alternatively or in addition, and in substantially any implementation of this method the steps of transmitting may include transmitting the radiation through the interface that is devoid of an adhesive material between the first substrate and the first lens element and/or further include a step of acquiring the output radiation that has emanated from the output facet with a first photovoltaic cell dimensioned to substantially match a size of the output facet. Furthermore, a method may be complemented by a step of acquiring diffused radiation that has propagated through the lens system and across the tops and bottom surfaces of the first radiation guide with a second photovoltaic cell positioned along the bottom surface.

BRIEF DESCRIPTION OF THE DRAWINGS

The invention will be more fully understood by referring to the following Detailed Description of Specific Embodiments in conjunction with the Drawings, of which:

FIGS. 1C, 1D are tables summarizing typical opto-geometrical parameters of the embodiment of FIGS. 1A, 1B.

FIGS. 4A, 4B include plots illustrating material transmittance characteristics of different polymeric materials.

FIGS. 4C, 4D show, respectively, experimentally-measured transmission spectra of the silicone material, of various thicknesses, for use with an embodiment of the invention; and the AM 1.5 solar spectrum.

FIGS. 6A, 6B, and 6C provide additional details describing the embodiment of FIGS. 5A, 5B.

FIGS. 11A, 11B, 11C and 11D illustrate a related embodiment of the lightguide of the invention.

FIG. 12 illustrates performance of an optical system including optically-cooperated lens of FIGS. 1A, 1B and the lightguide of FIG. 11A, 11B, 11C and 11D.

FIGS. 13A, 13B include plots representing tolerance of the system of FIG. 12 with respect to various transitional misalignments.

FIGS. 14A, 14B are plots representing tolerance of the system of FIG. 12 with respect to various angular misalignments.

FIGS. 16A, 16B illustrate a non-limiting structural modification to the embodiment of FIGS. 11A, 11B.

FIG. 17 includes a table summarizing some parameters of the embodiment of FIGS. 11A, 11B.

Figure 1A:
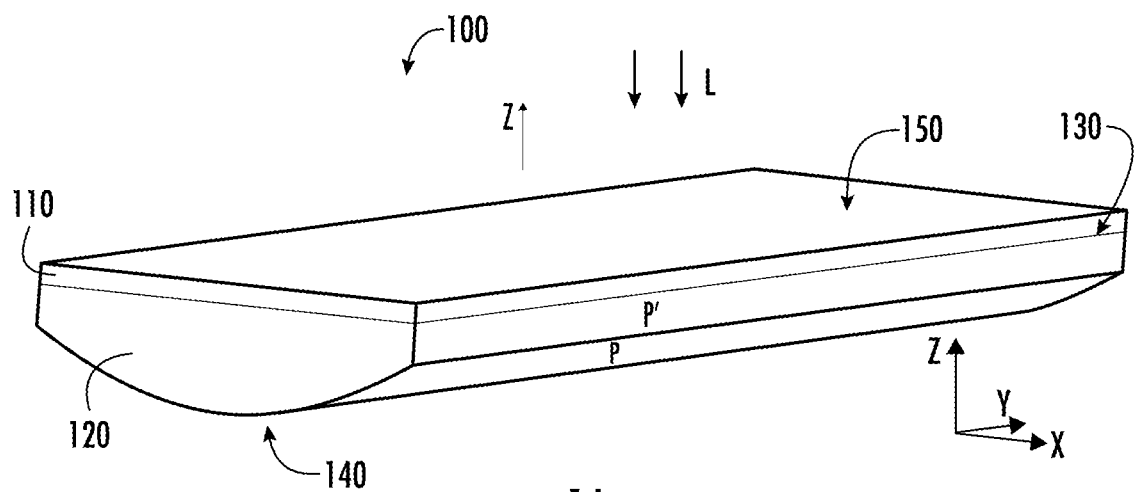
FIGS. 1A and 1B show, in perspective and side views, respectively, a schematic of a linear light-concentrating aspheric lens component according to an embodiment of the invention.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another. Generally, unless specified otherwise, dimensions are shown in mm.

DETAILED DESCRIPTION

Throughout this disclosure, and unless specified otherwise, the terms "linear lens", "linear lens element", "linear lens array", "linear concentrating optic (or radiation)" and similar terms are used and defined to refer to either a single optical component that is configured to converge light, incident onto an input facet of the optical element in the form of a collimated beam or as a substantially plane electromagnetic wave (having a substantially planar wavefront, as understood in the art) into a substantially one-dimensional distribution of light (as viewed at or in the vicinity of the focal plane of the optical element), or to a combination of such optical components. One non-limiting example of a linear concentrating optic would be a cylindrical lens, dimensioned to form a focal line—as opposed to a focal point—at its focal plane. The term acylindrical lens or lens element is defined as the one describing the substantially cylindrical lens the descriptor of the surface curvature of which is modified with an appropriate non-zero conic constant.

As used herein, and unless specifically defined otherwise, the terms "lenslet" and lens element" define a single optical component (not compound, that is, not including multiple optical components) that changes the degree of collimation/divergence/convergence of light propagating through it. In comparison, the term "lens" is defined to refer to either a lenslet or to a combination of lenslets. For example, a cemented optical doublet, well familiar to skilled person, is an example of a lens, while any constituent component of such doublet is a lenslet. In a different example, a telescopic system is an example of a lens.

When discussing a component possessing or characterized by zero power (for example, a zero optical power), a reference is made to a component dimensioned to not change a degree of divergence or convergence or collimation of a wavefront of radiation incident on this component as a result of transmitting such wavefront through the component. Accordingly, a component that changes a degree of divergence of a wavefront of radiation interacting with such component possesses a non-zero power (in case of radiation being light—non-zero optical power).

Embodiments of the invention address the problem of operational deficiency of the existing radiation-concentrating (in a specific case—sunlight-concentrating) elements and/or systems (which may include the linear-optic- and/or lightguide-based concentrators). For example, mirror-based solar concentrators require robust and costly mechanical designs due to their weight, which increases installation costs. Linear Fresnel lenses are known to have low, operationally-insufficient optical performance while, at the same time, the facets/surfaces of such lenses render the process of fabrication challenging (indeed, the fabrication error on the Fresnel lenslet's facets due to the draft molding angles results in non-uniform irradiance, which causes low efficiency of the solar concentrator). Optical cylindrical lenses made of glass—while arguably being suited the best for solar applications requiring small line light-concentration performance—are well recognized to be difficult and costly to manufacture for mass production. Similarly, lightguide-based solutions conventionally do not lend themselves to mass-production processes. Existing polymer lenses and lightguides possess high absorbance in the UV and NIR portions of the solar spectrum, which drastically limits their use in spectrally-broadband solar energy concentrators.

Silicone-based polymers are quite appealing materials for use in sunlight-concentration applications—especially, in combination with multi junction photovoltaic cells—as such materials are transparent over very broad spectral regions, for example between about 300 nm and about 1700 nm. And yet, silicone-based materials are well recognized to be soft, and optical elements made from such materials are prone to deformation when they are subjected to external constraints, such as stress due to externally-applied force.

As discussed in this disclosure, problems accompanying the use of currently-known solar concentrators are solved by devising concentrators that employ at least one of the specifically-configured acylindrical lens(es) (and/or arrays of such lenses) and/or lightguide(s) to enhance optical throughput and achieve high concentration ratios while satisfying tight spatial constraints and the need to utilize micro-sized PV-cells. (Currently existing freeform solar devices are mostly used for illumination applications. Other types of solar devices utilizing optical slabs to harvest light require large solar cells and/or the use of fluids to achieve light trapping.)

In particular, the operational problems accompanying the lens-based optics currently-utilized in linear concentrators of light are solved with design and manufacture of silicone-based linear lenses or lens element specifically configured according to the idea of the current invention. The proposed solution turns on a complex lens element containing two structurally- and operationally-different parts in contact with one another, which makes use of structuring a curved surface of such lens element as a generally aspherical (and more specifically—acylindrical) surface. As shown below, the use of such a complex lens element proved to reduce optical aberrations, facilitated high concentration of sunlight, to allow for reduction of the back focal length as compared to traditional spherical (and/or cylindrical) surfaces (for which a conic constant, considered in a given cross-sectional plane, substantially equals to zero) while, at the same time, simplifying the fabrication methodology via the use of molding.

Alternatively or in addition, operational problems that persist in current CPV technology—that uses multi junction PV cells and light-concentrators based on parabolic mirrors (known to be limited in terms of tolerance to a chance of position of the Sun) or spherical lens arrays (limited with respect to a level to which the irradiance of collected sunlight can be increased, often referred to as "concentration ratio")—are solved by using freeform optical devices that include a judiciously shaped lightguide with or without the use of an embodiment of auxiliary linear lens(es) to enhance optical throughput and achieve high solar-light concentration ratios for micro-sized PV-cells; freeform optics do not have axes of rotation and generally cannot be described by a single surface equation. The design and optimization of a given design is carried out with non-sequential raytracing software.

In particular, embodiments of the proposed lightguides were optimized to harvest the solar spectrum under the constraint of using silicone polymer as a base material. The chosen material base provides several operational advantages over glass or metallized lightpipes, among which: 1) a possibility of fabrication with molding techniques, 2) a possibility of freeform design including mechanical mounting features, 3) low cost manufacturing/production, 4) lower weight than equivalent glass system allowing low cost solar tracking, and 5) unlike other polymers, silicone polymer has high transparency not only in the NIR and visible spectrum but also in the UV which is useful for multi junction solar cells requiring solar UV harvesting.

Example 1

Figure 1B:
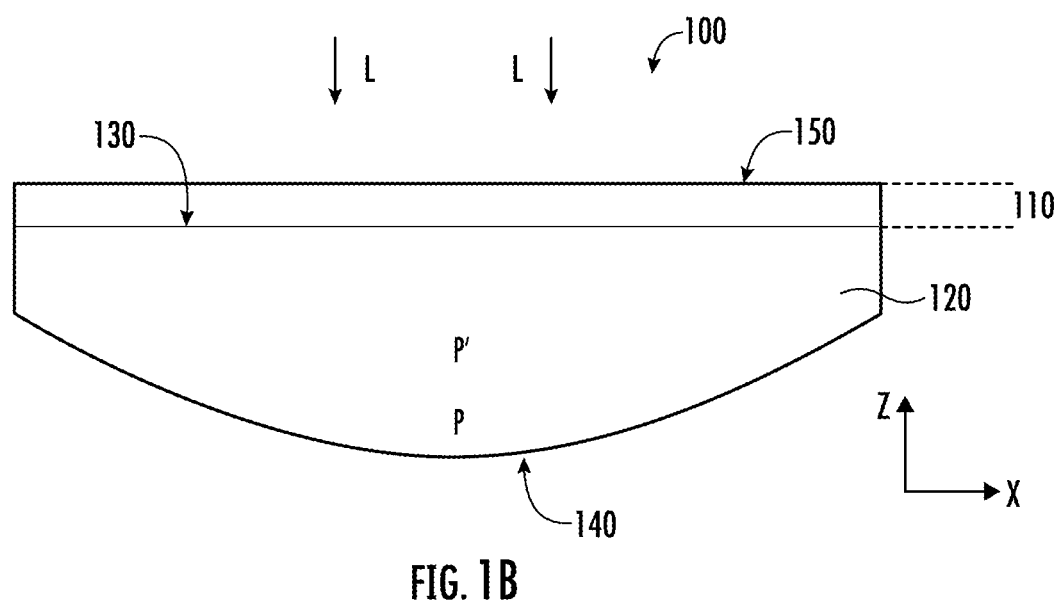

An embodiment 100 of the composite lens of the invention, schematically illustrated in FIGS. 1A, 1B, includes a first sub-component 110 and a second sub-component 120, and is dimensioned to converge light L that is incident onto the input facet 130 of the sub-component 120, substantially only along one axis (that is, in one direction). In advantageous comparison with lenses of related art, the embodiment employs an optical plate as a substrate (forming the sub-component 110, which in one case is a substantially zero-optical-power component such as a plane-parallel plate or an optical wedge with a non-zero wedge apex angle). Such substrate 110 is preferably made of a material (such as glass, for example) that possesses a higher mechanical rigidity than the material from which the sub-component 120 is made. As shown, the component 110 is structured as a plane-parallel optical plate.

In one implementation, the output surface (shown as a curved surface 140) of the stand-alone sub-component 120, configured as a lens element or lenslet, is made to be an aspheric surface; that is, a surface the curvature of which is not a constant value as a function of angle when viewed from the center of the curvature in a plane containing an optical axis (shown in FIG. 1B as the z-axis) of the sub-component 120. Opto-geometrical parameters of one specific embodiment of the lenslet 120 are summarized in FIGS. 1C and 1D, which show that the lenslet 120 is an acylindrical lenslet with a generally toroidal shape in an xz-cross-section, with a cylindrical radius of 13.718 and the conic constant of −1.8880. The radius of the output surface of lenslet 120 changes, according to an equation containing this conic constant, as a function of the angle at which such surface is viewed from a center of curvature of the surface in a cross-sectional plane containing the radius.

Figure 2:
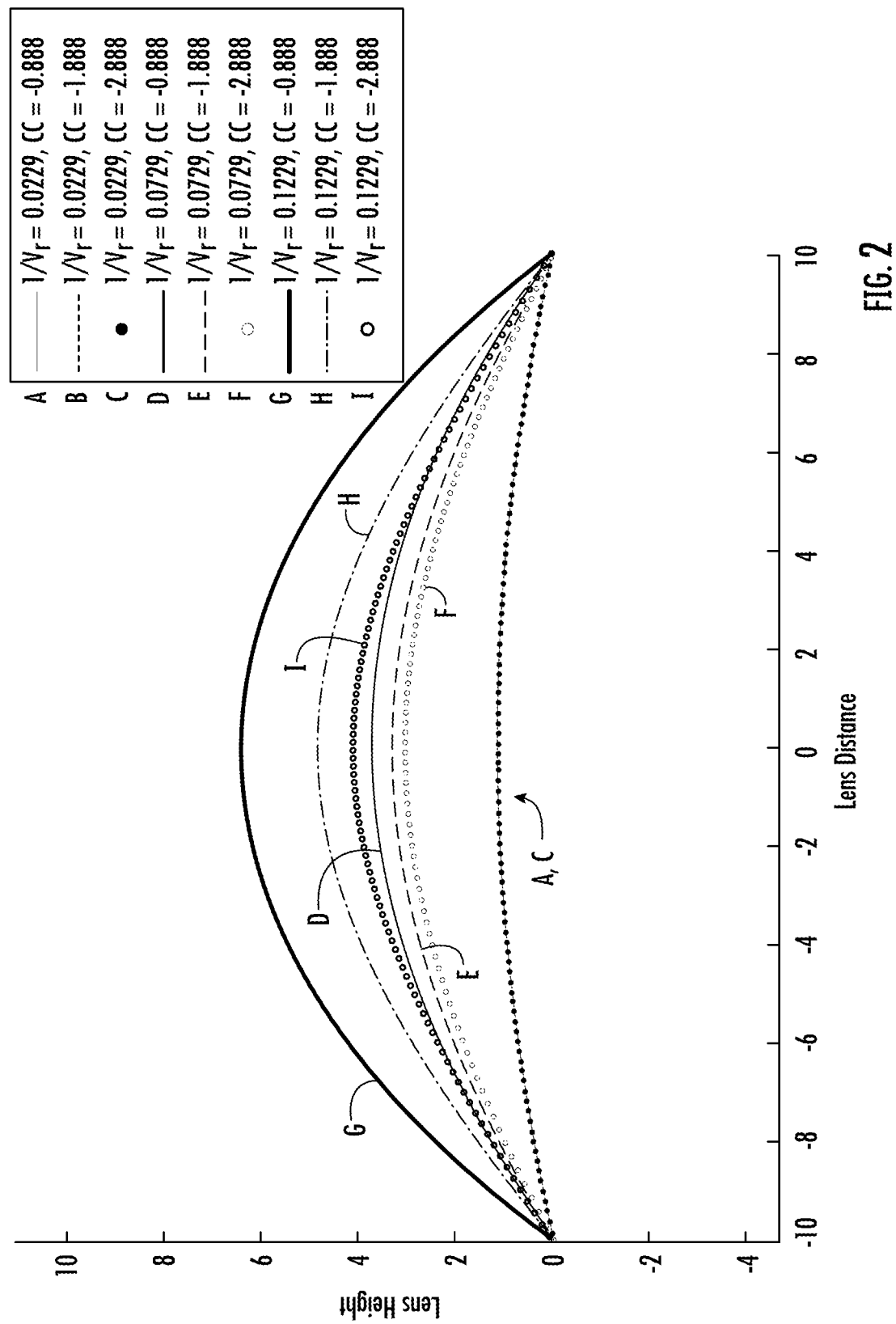
FIG. 2 contains plots illustrating profiles of a surface of a single lens element configured according to the idea of the invention for various opto-geometrical parameters. Here, $1/V_r$ is the curvature (reciprocal to $R_e$, which denotes a radius of curvature) of an output surface of the lens element, and CC denotes the conical constant.

As has been already alluded to above, the profile of the outer/output surface of the sub-component 120 can differ in related embodiments, depending on the specific application that may require different conic constants and/or curvatures. Some of the possible variations are referred to in FIG. 2, illustrating examples of various profiles of the surface 140 as a function of the curvature value and a conic constant. As seen from FIG. 2, the profiles of the output acylindrical facet 140 of the embodiments of the lenslet 120 of the invention range from, for example, the one with a curvature value of 0.229 and the conic constant of −0.888 to the one with a curvature value of 0.229 and the conic constant of −2.888; or from the one with a curvature value from 0.0729 and the conic constant of −0.888 to the one with a curvature value of 0.0729 with a conic constant of −2.888, etc. While only several specific discrete examples are illustrated, embodiments of the acylindrical lenslet of the invention are characterized by a curvature ranging from about 0.229 to about 0.1229 and/or with a conic constant ranging from about −0.888 to about −2.888.

In one case, the embodiment of the subcomponent 120 is preferably made of a silicone material based on polydimethylsiloxane, the inherent properties of which make it an attractive choice over various organic polymers, in particular for solar applications. Among the advantageous characteristics are excellent optical clarity, operationally-sufficient chemical resistance, excellent photochemical stability, thermo-mechanical stability and cost-effective fabrication. In particular, higher transmittance in the UV and NIR wavelength regions, as compared with those of other polymers such as polymethylmethacrylate (PMMA) or polycarbonate (PC), see FIGS. 4A, 4B, is used to reduce absorption at these wavelengths of interest and, therefore, reduce photo-degradation and thermal deformation of an optical component 120 made of such material. In case of solar applications, these properties provide significant benefits by reducing the requirements of maintenance of the overall optical system. FIG. 4C illustrates the empirically-measured transmission spectrum of the bodies of silicone material, proposed for fabrication of the sub-component 120, of different thicknesses. The material has greater than 92% transmittance in the UV-VIS and NIR wavelength range (from about 350 nm to about 1400 nm) except, possibly, for one narrow dip near 1200 nm. This material also demonstrates over 96% optical internal transmittance of a 8.1-mm thick glass slab. The fabrication of the sub-component 120 from the material of choice with the use of a molting technique resulted in an optically-smooth (rms of about 0.025 to 0.050 microns) surface 140.

And yet, such silicone material possesses notable disadvantages that limit its applications, including low hardness, which leads to deformation under applied stress. To address this issue, and to ensure the mechanical stability of the individual lenslet 120 (or an array of such lenslets), the lenslet was additionally bonded to the sub-component 110. The sub-component 110 in one embodiment was dimensioned as a substantially plane-parallel optical plate or substrate, preferably made of material possessing a higher mechanical rigidity than that of the sub-component 120 (such as glass, in one example). As a result, the substrate 110 added rigidity to the lens element 100 (or the array of such lens elements), which can prevent mechanical deformation due to the ambient environment. The plate or substrate 110, when used in conjunction with the lenslet 120 to form the lens element 100, also allowed for application of an auxiliary coating (in one non-limiting example—an anti-reflection coating) on the front, incident surface 150 of the embodiment 100, which reduced the Fresnel reflection related optical loss during the exploitation of the embodiment 100.

Notably, the integral cooperation of the components 110 and 120 is preferably carried out with a plasma treatment (for example, in vacuum) of the facing each other surfaces of the components 110, 120 to activate involved surfaces and without the use of an adhesive. This manufacture of the complex lens 100 not only shortened the otherwise conventionally-employed sequence of fabrication process steps but also reduced optical loss (as a result of eliminating refractive index changes caused by the conventional presence of an adhesive between the two materials). Notably, until now the related art has been silent about the use of combination of an aspheric linear lenslet with a mechanically-supporting substrate cooperated with such lenslet with the use of plasma treatment.

Referring again to the illustrations of FIGS. 1A, 1B, the axial (along the y-axis) thickness of the specific embodiment 100 is about 5.3 mm while the edge thickness is about 2.0063 mm. Front and back focal lengths are respectively, 32.959 mm and 29.217 mm.

Figure 3B:
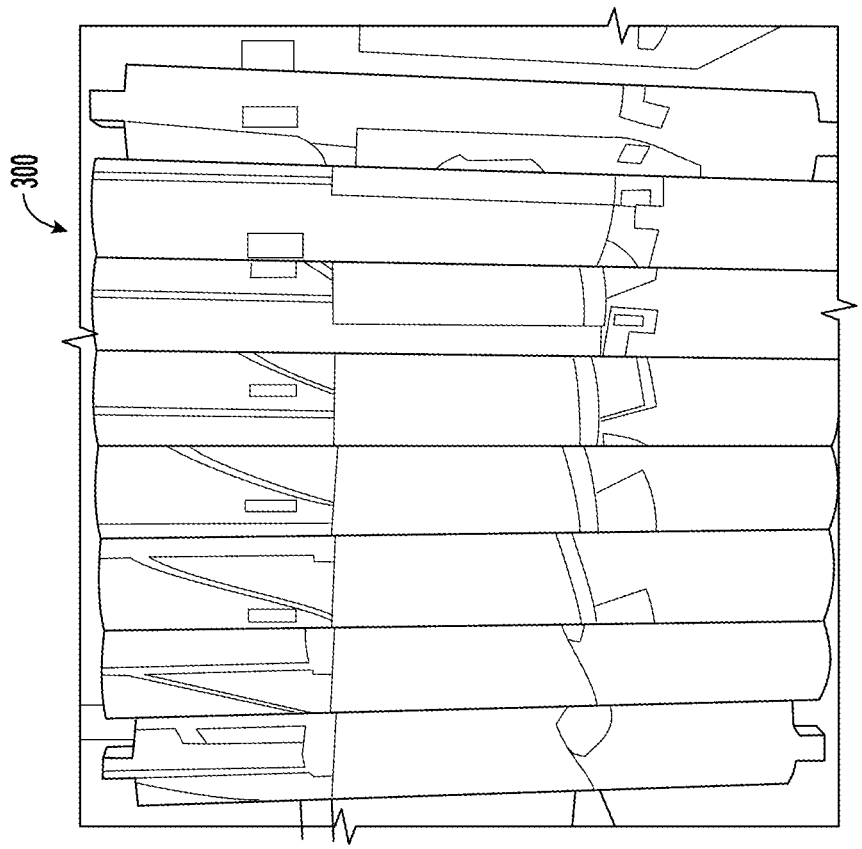
FIGS. 3A, 3B illustrate an array of lens components configured according to the idea of the invention, in side and front views, respectively. The array of linear acylindrical lenses is made with PDMS attached to a glass slab for rigidity using the plasma process technique. In the picture on the right, the array focuses broadband collimated light (350-2000 nm).
Figure 3A:
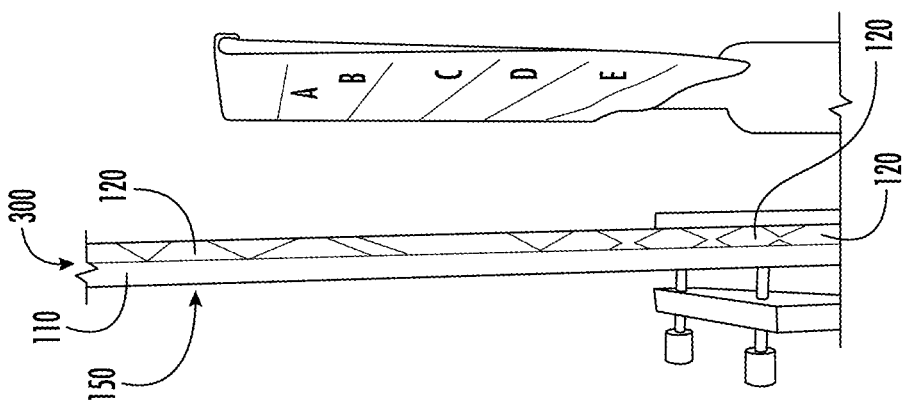

It is appreciated that a related embodiment may include an array of complex lenses such as the lens 100. One example of embodiment 300 is shown in FIGS. 3A, 3B. FIG. 3A illustrates the embodiment 300 in side view, with the sub-component 110 on the left and the array of acylindrical lenslets 120 on the right: it includes a multiplicity of sub-components 120 backed-up and supported with a single large-area subcomponent 110. FIG. 3B shown the same in front view, with the surfaces 140 of the array of the lenslets 120 facing the viewer. As shown in FIG. 3A, the planar optical wavefront incident onto the input surface 150 of this array is converged to an array of substantially one-dimensional (referred to herein as linear) distributions of light (shown as A, B, C, D, and E) at a screen 310 disposed at focal plane of the lens array 300. In one specific example, to form the array 300, the array of lenslets 120 was attached to a glass slab 110 of Borofloat 33 (with $n_C$=1.469). However, substantially any type of glass can be used as substrate 110 in a related embodiment (here, materials with low values of refractive indices may be preferred to reduce Fresnel losses during the operation of the lens element/array).

It is also appreciated that the practical use or employment of either the individual lens such as the lens 100 or an array of the lenses such as the array 300 may be carried out in conjunction with the use of a lightguide similar or identical to the one described below, to form a lens/lightguide system to additionally enhance the degree of spatial concentration of light. In such a case, the linear (substantially one-dimensional) distribution(s) of light, formed by the embodiment of the present invention from light having a substantially planar wavefront and incident onto the front/input surface of the lenslet 120 (for example, upon the propagation through the substrate 110), can be further collected and/or channeled towards the target surface or optical device with the use of an appropriate embodiment of the lightguide.

A skilled artisan will readily understand, therefore, that an embodiment of the invention provides a lens system that includes a first lens element made of a first material and having a first optical axis and a first and second surfaces that are transverse to the optical axis. Such optical system additionally includes an optically-transparent substrate made of a second material and having a substantially zero optical power, which is affixed to the first surface to form a first interface between the substrate and the first lens element. In any implementation, the first lens element may be a generally linear lens element the curved surface of which is modified according to a specifically-chosen conic constant, while the interface does not include an adhesive material. The lens system may additionally include a second linear lens (which in a specific case can be made substantially identical to the first linear lens element; or alternatively have opto-geometrical characteristics that differ from those of the first lens element) such that the first and second lens element form an array of lens elements. (In a specific case, the optical axes of different lens elements in such array may be not parallel to one another.)

A method for spatially concentrating radiative power (radiation in general, and optical power in particular, in a specific example—solar power) with an embodiment of the invention includes a step of at least partially transmitting radiation incident on a radiation-transparent substrate (configured to not change a degree of divergence or convergence or collimation of the wavefront of radiation incident on the substrate, and/or be shaped as a wedge or as a plane-parallel plate) through interfaces between a first material of this substrate and a second material of an array of lens elements. (Here, each lens element is configured to have a corresponding optical axis and transmittance in excess of 85% in a spectral region of choice such that each of the present material interfaces is devoid of an adhesive material.) The embodiment of the method additionally includes a step of forming areas of irradiation with such radiation in a chosen plane as a result of transferring this radiation through bodies of individual lens elements of the array, wherein the areas of irradiation are dimensioned to define a plurality of substantially parallel stripes of light. (In any case, the stripes of light may be dimensioned to be substantially one-dimensional lines of light and/or be spaced non-equidistantly from one another in the chosen plane.) In any implementation, the step of at least partially transmitting may include passing sunlight through the first material and the second material that is different from the first material. The specific implementation of a method may additionally include receiving the radiation (that has not been channeled through a lightguide component) at the chosen plane—for example, with a PV-solar cell disposed at this plane), It is also understood, therefore, that an embodiment of the invention addresses a method for fabricating a lens system, which includes molding an array of lens elements; exposing a first surface of the array and a first surface of an optically-transparent substrate to plasma to form a plasma-treated surface of the array and a plasma-treated first surface of the substrate; and applying pressure to a combination of the array and the substrate while the plasma-treated first surface of the array and the plasma-treated first surface of the substrate are in contact with one another to form a temporally-stable bond between these first surfaces in absence of an adhesive between these first surfaces. In one implementation, the array of lens elements includes a linear acylindrical lens element which, in a specific case, is characterized by a surface curvature with a value in a range from about 0.229 to about 0.1229 and/or with a conic constant with a value in a range from about −0.888 to about −2.888. In any implementation, the optically-transparent substrate may include an optically-transparent plate possessing a substantially zero optical power (which plate can be shaped as a wedge in one case or as a plane-parallel plate). The step of molding may include molding the array of lens elements having a transmittance in excess of 85% at substantially every wavelength in a spectral region between 350 nm and 1100 nm.

Fabrication of the above-described optical elements and subsystem included, in one case, the double casting method (discussed, for example, by K. Kwapiszewska et al., in AIMS Biophys., 3(4), 553-562, 2016) to investigate how the silicone material properties appear in real optical devices. A PMMA acylindrical lens array and an optical funnel were used as original masters. A negative mold was made in PDMS (Sylgard 184, Dow Corning) with a 9:1 mixing ratio. After 48-hour, 100° C. thermal aging of the negative mold, the replica was obtained by casting MS-1001 onto the negative mold and curing at 70° C. for 1.5 hour. The fabricated optical elements were temperature cycled to simulate a practical outdoor environment for 100 cycles between −20° C. and 70° C. For lenses, the optical transmittance and the back focal length were measured before and after temperature cycling for the PMMA acylindrical lens array master and MS-1001 replica, respectively. The results are shown in the Table below. The back focal lengths of both MS-1001 and PMMA embodiments of the lenses of the invention have no significant change after the temperature cycling test. There is a significant reduction of transmittance for the PMMA lens in comparison to the MS-1001 lens, indicating less degradation in the MS-1001 case. The optical transmission difference between PMMA funnel and MS-1001 replica was negligible.

TABLE

Characterization of PMMA and MS-1001 lenses for temperature cycling test.

| | Back focal length (mm) | | | Transmittance (%) | | |
|---|---|---|---|---|---|---|
| | before cycling | after 100 cycles | $\Delta f/f$ (%) | before cycling | after 100 cycles | $\Delta T$ (%) |
| PMMA lens | 16.2 | 16.5 | +1.85 | 85.44 | 81.13 | −4.31 |
| MS-1001 lens | 21.8 | 21.6 | −0.92 | 87.43 | 86.24 | −1.19 |

Example 2

Figure 5A:
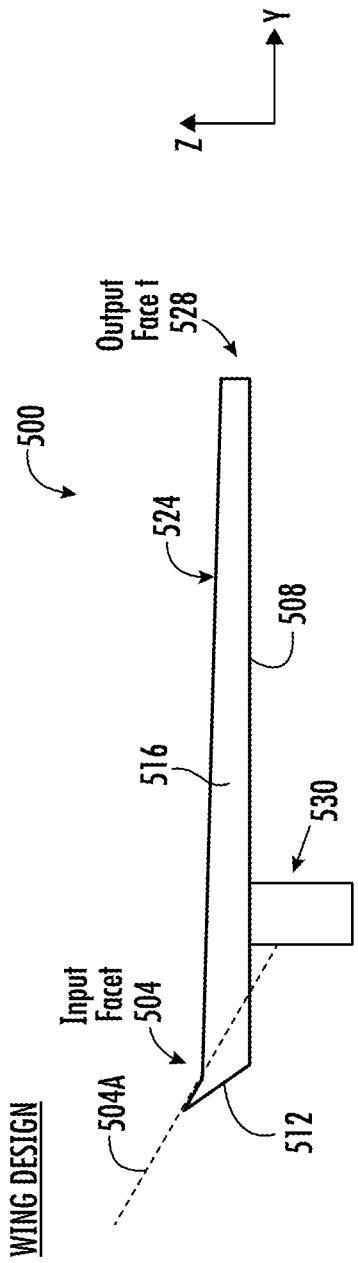
FIGS. 5A, 5B schematically illustrate an embodiment of a lightguide in two different views.
Figure 5B:
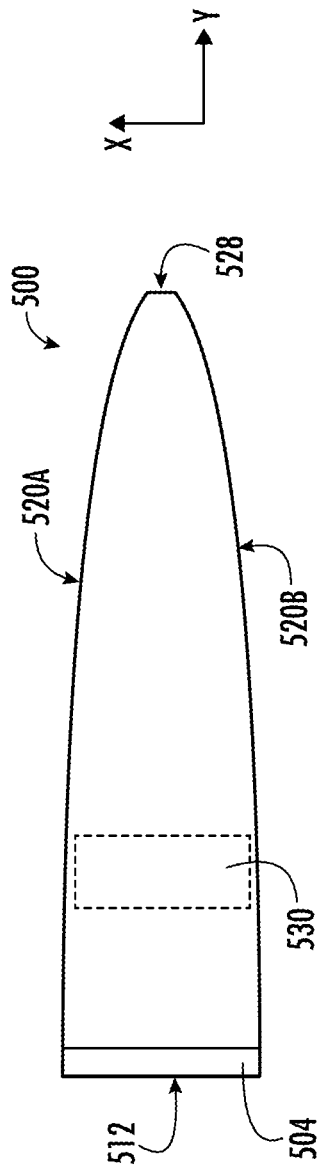

An embodiment 500 of a freeform multimodal waveguide or lightguide configured to increase the irradiance of light upon light propagation from the input facet of the lightguide along the lightguide's channel to the output facet of the lightguide—in other words, configured to spatially concentrate light channeled through the lightguide—is schematically illustrated in FIGS. 5A and 5B (showing the side and top views, respectively, of the design referred to herein as "Wing design").

As shown, the lightguide 500 includes an input facet 504 that is substantially coplanar with the plane 504A (which in turn is transverse to at least the bottom surface 508 shown to be substantially coincident with the xy-plane). The lightguide 500 also has a first or auxiliary wall or facet or surface 512 that—together with the input facet 504—defines the extent of the "wing" of the lightguide 500; the body 516, limited by the side walls 520A, 520B (each of which has a substantially curved—in one case, parabolic—profile); the bottom surface 508; and the top surface 524. The side walls 520A, 520B are, therefore, are not parallel to the axis of the body 516. Alternatively or in addition, the input facet may be oriented to be transverse to the surfaces 524 and/or 512. In any implementation, a cross-sectional profile of at least one of the two walls 520A, 520B in a plane transverse to such wall may be substantially parabolic.

In the shown implementation the top and bottom surfaces 524, 508 may be not parallel to one another. The lightguide output facet 528, which is transverse to the axis of the lightguide 500 and both the bottom and top surfaces 508, 524, terminates the lightguide 500. (In a specific implementation, the output terminating facet 528 may be substantially perpendicular to the bottom surface 508.) The lightguide 500 can be optionally configured with a mechanical support configured for spatial alignment of the lightguide (shown as foot or base 530), and fabricated as a monolithic, single-component device if so preferred.

The embodiment 500 is based on a freeform design, which provides several advantages over traditional lightguides: spatial concentration of channeled light with higher throughput; simpler design, lending itself to manufacture with the use of molding techniques; reduced optical path at least in a direction corresponding to the direction of incidence of light onto the input facet (vertical direction, along the z-axis as shown) for applications with space constraints; scalable lightguide dimensions to achieve control over the output spot of light (at the output facet 528); and advantageously-increased tolerances for solar tracking, as compared to other concentrating solar systems. In particular, freeform design indicates that this design and embodiment achieves higher optical concentration than prior art embodiments that dispose the output facet in the same plane as the bottom surface; there are also assembly and packaging advantages to adopting embodiment 500.

Figure 6A:
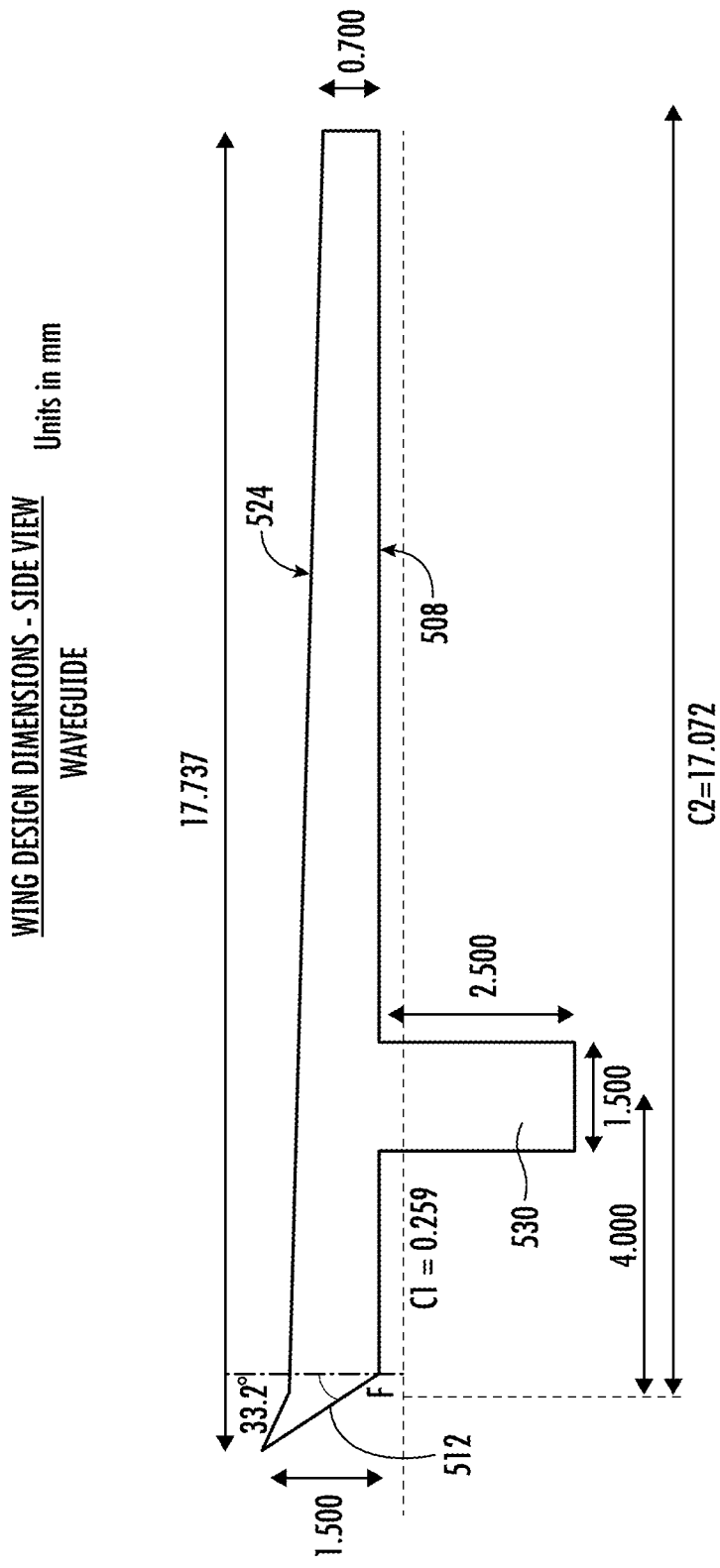

The implementation 500 of this device includes a) a lightpipe portion, configured to guide/channel light with the use of total internal reflection (TIR) and, while doing so, to spatially-concentrate light without a need to use any reflective coatings, and b) a base, dimensioned to support and align the lightguide with the receiver (such as an optical detector, for example, or another device) placed at or near the output facet 528. When used for collection of and as a concentrator of the sunlight, the embodiment 500 redirects the sunlight from the zenith-axis (z-axis as shown) to a horizontal axis (parallel to the bottom surface 508, y-axis as shown) and thus is well-suited for space-constrained applications. Non-limiting example(s) of geometry and related operational characteristics of the embodiment 500 that contain(s) the otherwise optional foot 530 and fabricated as a monolithic device is (are) indicated in FIGS. 6A, 6B, and 6C. FIG. 6B itemizes at least some of the operational characteristics (such as, for example, the overall light efficiency or throughput and the fact that the minimized-size concentrated PV-cell can be effortlessly added via index matching to the output facet 528) for the embodiments with geometrical parameters shown in FIG. 6A (The Standard Air Mass 1.5 (AM 1.5) solar spectrum was included in the modelled solar source, as well as the divergence of the sunlight. Non-sequential optical effects were considered, including Fresnel losses, total internal reflection, absorption, stray light, and auxiliary ray paths.)

Figure 6C:
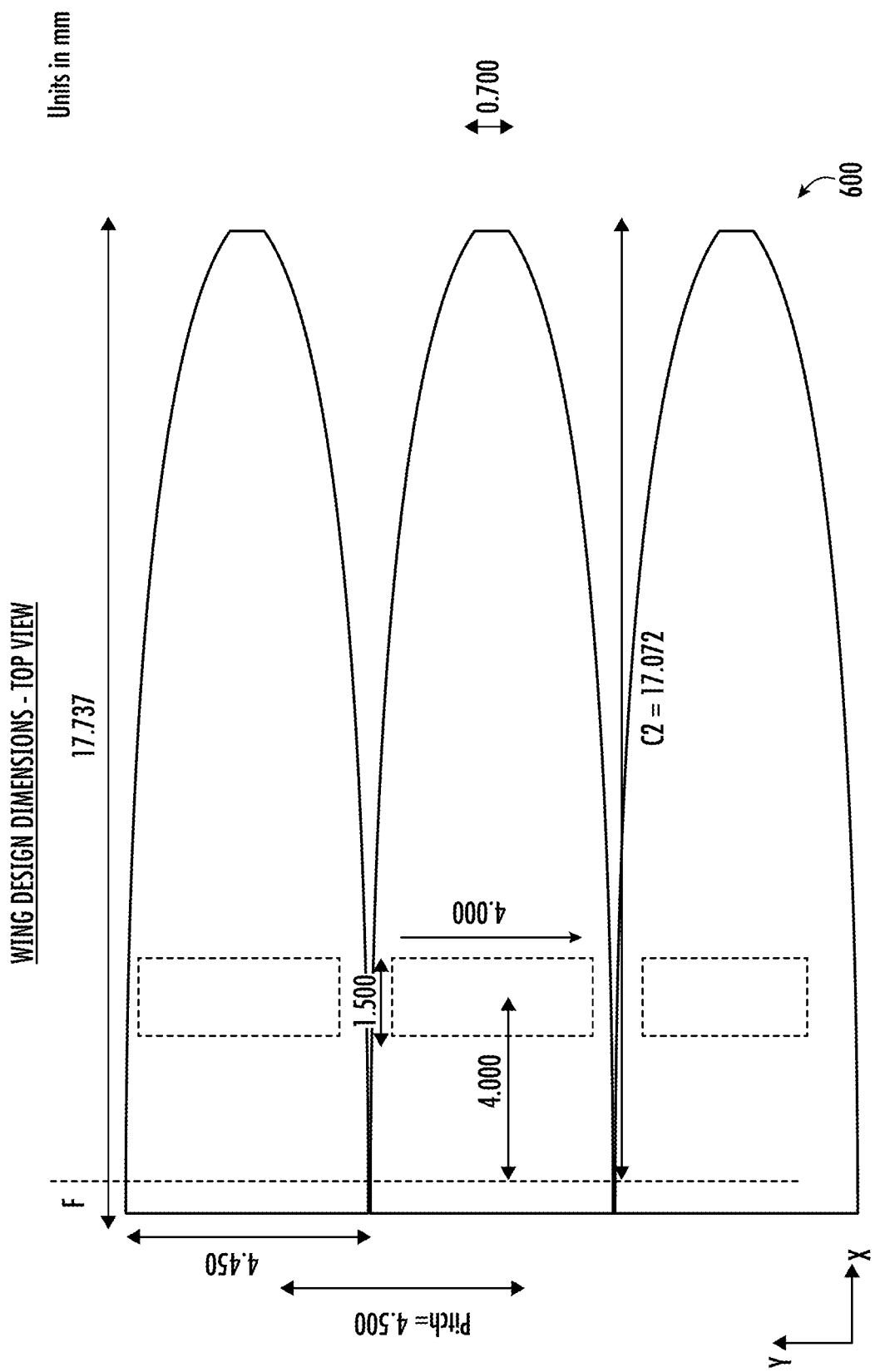

FIG. 6C, depicts an array 620 of the lightguides each of which is configured according to the embodiment 500, and which are disposed side-by-side. (It is understood, that the embodiment of the lightguide 500 can be physically and operationally combined and used with an additional optical device such as, for example, the lens 100 to have the light guide 500 receive the light from the output of the linear lens 100. Similarly, the embodiment 620 can be optionally combined/implemented with for optional use with an array of additional optical devices delivering light to the input facets of the individual lightguides of the array 620—in one specific case, the array 300 in which the number of constituent linear lenses is matched with that of the constituent lightguides in the array 620.

The skilled artisan will readily understand that an embodiment of the invention provides, therefore, an optical system that includes a first lightguide having input and output facets that are transverse to one another, and a tapered body bound by a top surface, a bottom surface, and two wall surfaces. Such body of the first lightguide is dimensioned to reduce first and second spatial extents of a distribution of light (when said light is channeled by the first lightguide from the input facet to the output facet), where the first spatial extent is defined along a first axis and the second spatial extent is defined along a second axis transverse to the first axis. The first lightguide additionally has an auxiliary facet disposed a) to spatially-limit the first lightguide and to ensure the TIR of light that has entered the first lightguide and that has traversed the input facet and b) to redirect this entered or input light towards the output facet. In one specific case, the planes of the input and output facets are neither parallel nor perpendicular to one another. In substantially any implementation, the input, output, and auxiliary surfaces may be planar surfaces, while in a related case at least one of these surfaces—for example, the auxiliary surface—may be curved to modify the curvature of the light wavefront incident upon it.

The embodiment 500 of a lightguide, when utilized as a solar concentrator on its own, is configured to increase the irradiance of light propagating therethrough by a coefficient of up to 30, by itself, and up to 550× if and when the embodiment 500 is combined with an auxiliary linear lens concentrator 100. Understandably, when the lightguide 220 is used with the lens 100, the light guide is concatenated with the corresponding lens 100. When used in such a combination, the lens system 100 precedes the lightguide along the optical path of light: in such a case, input light is first collected with the lens system, converged to a substantially one-dimensional distribution of light at a given plane (as shown with the numeral 610 in FIG. 6B), then collected/acquired/received at such plane by the lightguide 500 through its input facet 504, and then channeled towards the output facet 528, with which the CPV cell can be juxtaposed (via refractive index-matching material, for example).

The embodiment 500 is judiciously configured to achieve, in operation, at least three goals: 1) trapping of light using total internal reflection (TIR); 2) re-directing of light received by lightguide 500 through the input facet 504 from propagating substantially long the axis that is perpendicular to the bottom surface 508 (z-axis, as shown) to propagating substantially along the axis parallel to the bottom surface 508; and 3) spatially-monotonically concentrating/increasing the irradiance of channeled light upon its propagation from the input facet 504 to the output facet 528.

Figure 7:
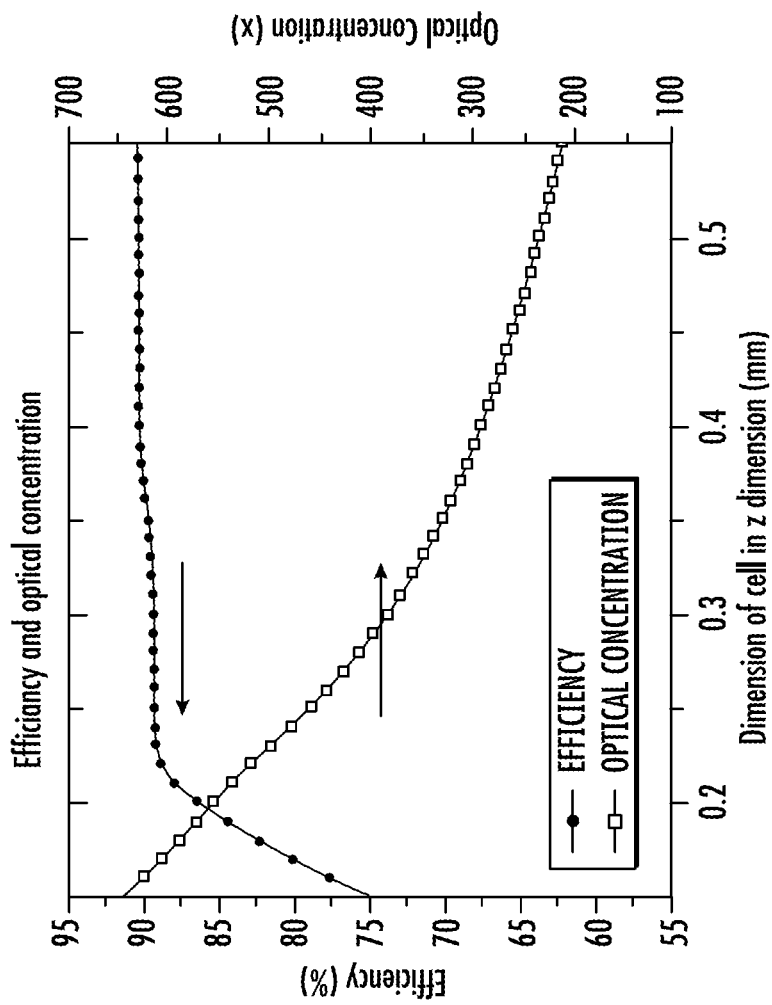
FIG. 7 is a plot showing the optical efficiency of the embodiment of FIGS. 5A, 5B implemented on different dimensional scales.

The dimensions of the embodiment 500 are easily scalable in practice. For example, FIG. 7 illustrates the degree of the sunlight concentration versus the size of the output facet 528 (that is, the efficiency of the device for different scale-factors, corresponding to various sizes of the output facet 528) plotted along the abscissa of the graph of FIG. 7. A lightguide scaled to have the output facet 528 of a smaller size increases the degree of spatial concentration of channeled light, but may result in higher optical losses upon lightguiding.

In one implementation, the embodiment 500 may be complemented by having a vertically-disposed (i.e., disposed along the plane parallel to the output facet 528) micro-concentrated photovoltaic (CPV) cell (which, in one implementation, may be a multi junction CPV) juxtaposed with the facet 528. In this case, the lightguide 500 may be bonded (under refractive-index-optimized conditions) to a CPV cell disposed substantially parallel to the output facet 528. Due to the typical dimensions of the existing CPV cells and transverse, vertical positioning of the CPV cell with respect to the lightguide axis, in case of such configuration light that is not at normal incidence (Direct Normal Irradiance—DNI) to the CPV cell—such as diffuse sunlight, for example—can be transmitted through the overall optical system and, optionally, harvested by other means (for example, with another larger-size PV cell) or transmitted through, or used for illumination purposes when the overall optical system is installed in a roof or a window-cell of a building.) Accordingly, one embodiment of the optical system of the invention additionally includes a first PV-cell affixed to the output facet (and, optionally, dimensioned to match the size of the output facet) and/or a second PV-cell disposed, in one case, along the tapered body in a plane transverse to the plane of the first PV-cell.

Figure 8A:
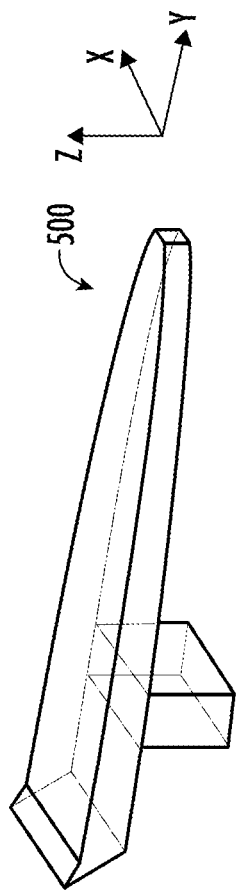
FIGS. 8A, 8B, and 8C present sketches of the embodiment of FIGS. 5A, 5B with identifiers illustrating parameters of operational tolerances of using the lightguide in solar applications.
Figure 8C:
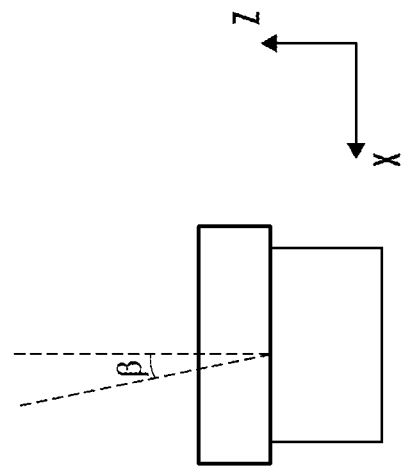
Figure 8B:
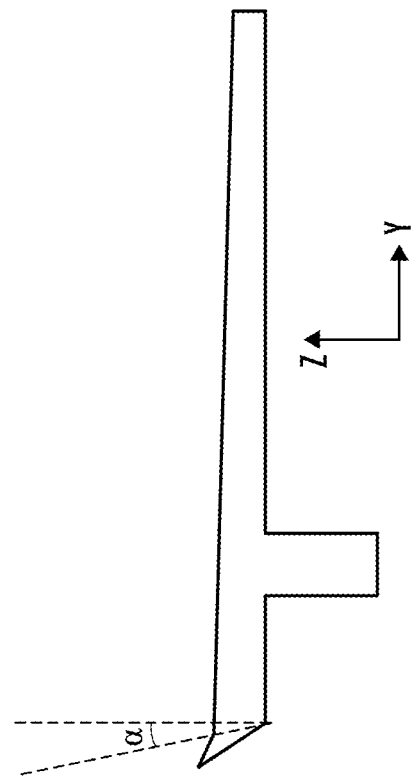

FIGS. 8A, 8B, and 8C present several sketches of the embodiment 500 to illustrate operational geometrical tolerances allowed when using the lightguide 500 in solar applications—specifically, of using the embodiment 500 in conjunction with a device or system configured to track a position of the Sun.

Figure 9A:
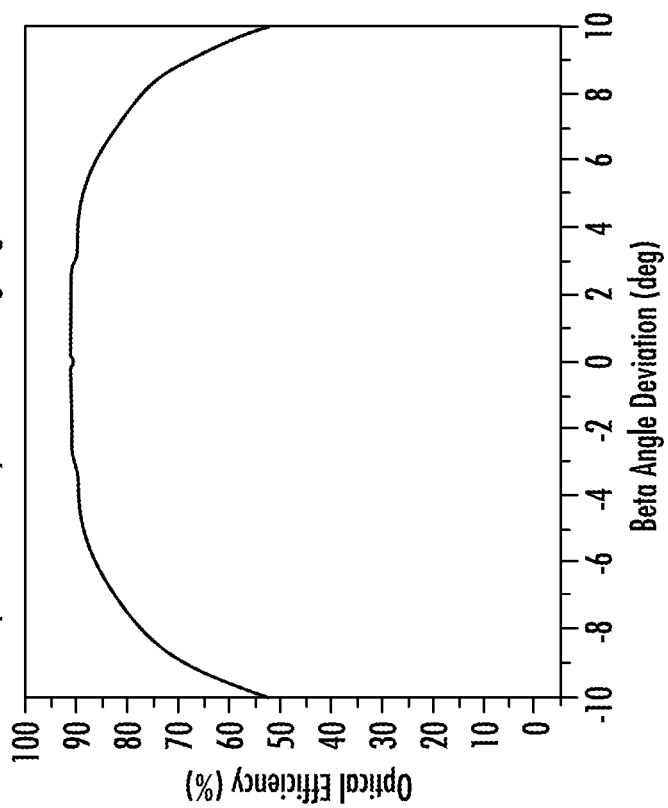
FIGS. 9A, 9B contain plots illustrating operational tolerances of the embodiment of FIGS. 5A, 5B in solar tracking.

When used for the purpose of high-level concentration of solar radiation, the lightguide of the invention has to be appropriately equipped for tracking a position of the Sun. Two tracking directions are shown in FIGS. 8A-8C. In the α-direction (tracking in the yz-plane), the embodiment of the lightguide 500 exhibits a tracking tolerance that is typical for CPV technology of related art (±0.5°). In a perpendicular direction, however—in the β-direction (tracking in the xz-plane), the operational tolerance is ±9°, which is a much higher (looser, less operationally-restricting) tolerance than those of related art, such as the case where an addition total internal reflection directs the output light to a CPV cell disposed in the plane of the bottom surface of the lightguide. The tolerance is depicted by plotting optical efficiency (defined as a ratio of irradiance of light collected by the optical component to irradiance of light incident onto the optical component) as a function of a corresponding tracking angle, in FIGS. 9A, 9B.

Figure 9B:
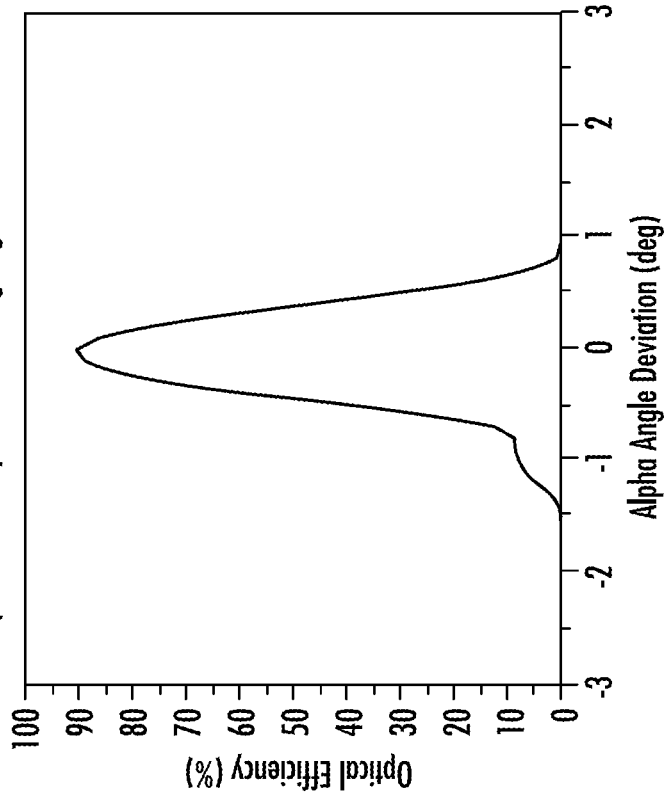
Figures 10A, 10B:
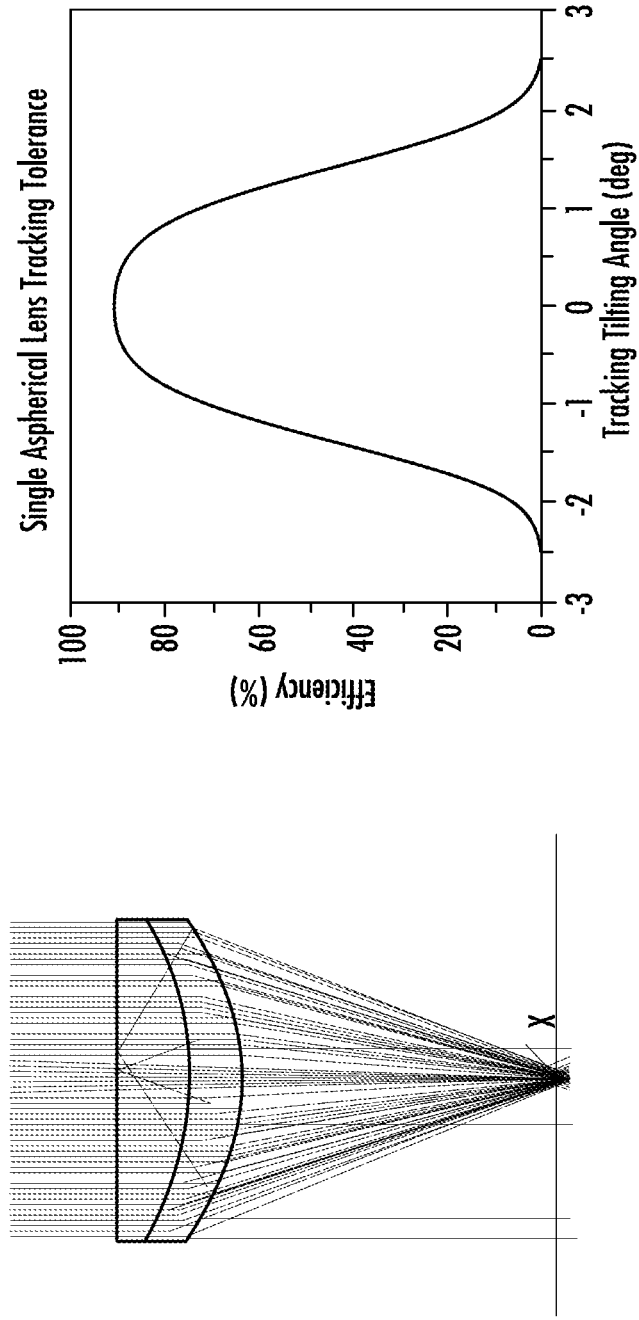
FIGS. 10A, 10B provide illustration of the angular tolerance of tracking the position of the Sun when a single aspherical lens is used as a sunlight collector and concentrator.

For the purposes of comparison of the efficiency of concentrating the sunlight with the use of the embodiment 500, the angular tolerance of tracking the position of the Sun with a single aspherical lens 1010 (used both as a sunlight collector and a concentrator) is illustrated in FIGS. 10A, 10B. The results demonstrate, therefore, that a solar power concentrator employing the lightguide 500 can be used in single-tracking applications than only require harvesting sunlight for few hours at a particular time. Indeed, the plot of FIG. 9B shows that the optical efficiency of the system 500 used as a solar collector and concentrator remains above 50% for the change of the angular position of the Sun within the range from about −10 degrees to about +10 degrees. (In a system that may be equipped for a dual-axis tracking, if a single axis is used to track then sunlight can be still collected for few hours due to large acceptance angle in beta direction.)

Example 3

A related embodiment 1100 of the freeform lightguide (referred to herein as "Horn design) is now described in FIGS. 11A, 11B, 11C, and 11D. The embodiment 1100, shown in perspective view in FIG. 11A, is substantially a structural combination of a horn-like 2-grade input facet tapered lightguide 1124 (referred to as a horn portion, as shown in side view, xz-plane in FIG. 11C) and a compound parabolic concentrator (CPC), which is shown in top view (xy-plane) of FIG. 11B. The CPC structure of FIG. 11B, having sidewalls 1104, 1108 each of which has a parabolic profile, is configured to focus a light wavefront propagating through the body 1110 of the embodiment (the CPC 1110) in one plane (in this case—in the xy-plane, which is substantially parallel to the bottom surface 1114 of the body 1110), xy-plane, while the taper of the body 1110 (defined by the bottom surface 1114 and the upper surface 1118) is configured to limit and narrow the cross-section of the channeled-light distribution in a transverse plane (here, in the xz-plane) that is substantially perpendicular to the output facet 1122 of the lightguide 1100. (Notably, generally a cross-sectional profile of at least one of the two walls 1104, 1108 in a plane transverse to such wall may be substantially parabolic.)

Geometrical parameters of one example the embodiment 1100 is summarized in FIG. 11C and include the dimensions of the complex-shaped horn portion 724, having at least two substantially-planar surfaces that that transverse to the axis of the horn portion 1124, as well as the geometrical parameters of the body (CPC) 1110 with the overall length of about 18.31 mm, the cone length of about 0.5414 mm, the xy-plane width at the plane of connection with the horn portion 1124 of about 4.45 mm (denoted in FIG. 11D as input size) and the width in xy-plane at the output facet of about 0.7 mm.

During the propagation from the input ('horn") portion 1124 of the embodiment 1100 (having the input facet 1128 that, in one implementation, may be substantially parallel to the surface 1114 and substantially perpendicular to the output facet 1122) towards the output facet 1122, the distribution of light channeled through the lightguide 1100 is substantially monotonically converged and limited in a cross-section to the area corresponding to the output facet 1122 (in one example—a 0.7*0.7 mm$^2$ area). If and when a PV-cell of a similar or equal size (such as a multi-junction PV cell, for example) is operably associated with the output facet 1122—for example, by index-matched bonding of the PV-cell to the facet 1122—the light accepted by the input facet 1128 of the horn portion 1124 of the embodiment 1100 is concentrated to and received by such PV-cell. The 2-grade horn portion 1124 is devised to have a larger tolerance to misalignment in the x-direction than the embodiment 500 due to a more gradual—as compared with the embodiment 500—redirection of the input light from the axis of incidence onto the input facet (here—the z-axis) towards the axis of output (here—the y-axis).

As seen in FIGS. 11A, 11C, the embodiment of the optical system 100 includes a first lightguide portion (between the input facet and the body and bound on one side by the auxiliary surface) that has an optical axis perpendicular to the input facet 1128. This first lightguide portion has a cross-section that monotonically decreases with a distance measured along the optical axis of the first lightguide portion from the input facet, the first lightguide portion having two side walls (surface 724 and at least one of the surfaces opposite to the surface 724 and spatially limiting the horn of the lightguide 1100) each of which is transverse to the optical axis of the first portion.

This embodiment 1100 provides an example of a lightguide that is also operationally compatible with an auxiliary lens-element-based light concentrator described in reference to FIGS. 1A, 1B, as discussed below.

Example 4

As shown schematically in FIG. 12, for example, showing the optical system 1200 in which the lightguide 1100 is disposed along the path of the collected light after the auxiliary lens system 1210 (configured according to the principles of the embodiment 100), the overall efficiency of the system 1200 (defined as the ratio of $P_{out}$ to $P_{in}$, that is the ratio of the light power output at the output facet 1122 of the lightguide 1100 ($P_{out}$) to the light power collected by the lens system 1210 ($P_{in}$)) is about 90.5%. This result is an estimate produced with the use of LightTools® ray tracing software. The efficiency of the lightguide 1100 operating to collect and concentrate the sunlight on its own (defined as the ratio of the light power output ($P_{out}$) at the output facet 1122 of the lightguide 1100 to $P_1$, the light power incident from the lens system 1210 onto the input facet 1128) is about 95%. The coefficient of increase of irradiance of light between the input facet of the lens system 1210 and the output facet of the light guide 722 is about 150.

To illustrate the operability of the optical system 1200, combining the sequence of the compound lens 1210 with the embodiment 1100 of the lightguide, various aspects of stability of collection and conversion of solar energy were addressed. Information presented in FIGS. 13A, 13B refers to the issue of alignment between the front element of the system 1200 (that is, the lens system 100) and the lightguide 1100. The plot of FIG. 13A shows the misalignment in the z-direction (which affects the efficiency of the system 1200 due to the changes in the separation between the lens system 1210 and the input facet 1128 of the lightguide 1100), showing an approximately 2 mm tolerance within which the efficiency of the system 800 is maintained above 80%. The curves of FIG. 13B illustrate the efficiency changes due to the displacement between the axis of the horn section 1124 of the lightguide 1100 and the optical axis of the lens system 1210.

Further, FIGS. 14A, 14B address the issue of potential angular misalignment between the components 1210, 1100 of the system 1200 of FIG. 12. Here, the angle "beta" represents a tilt of the lens system 1210 about the y-axis. The left curve shows the efficiency drop vs. tilt angle beta. (The tolerance of misalignment of the system with respect to the x-axis, discussed in reference to FIG. 13B, relates to the beta-angle misalignment of the lens 1410).

Figure 15:
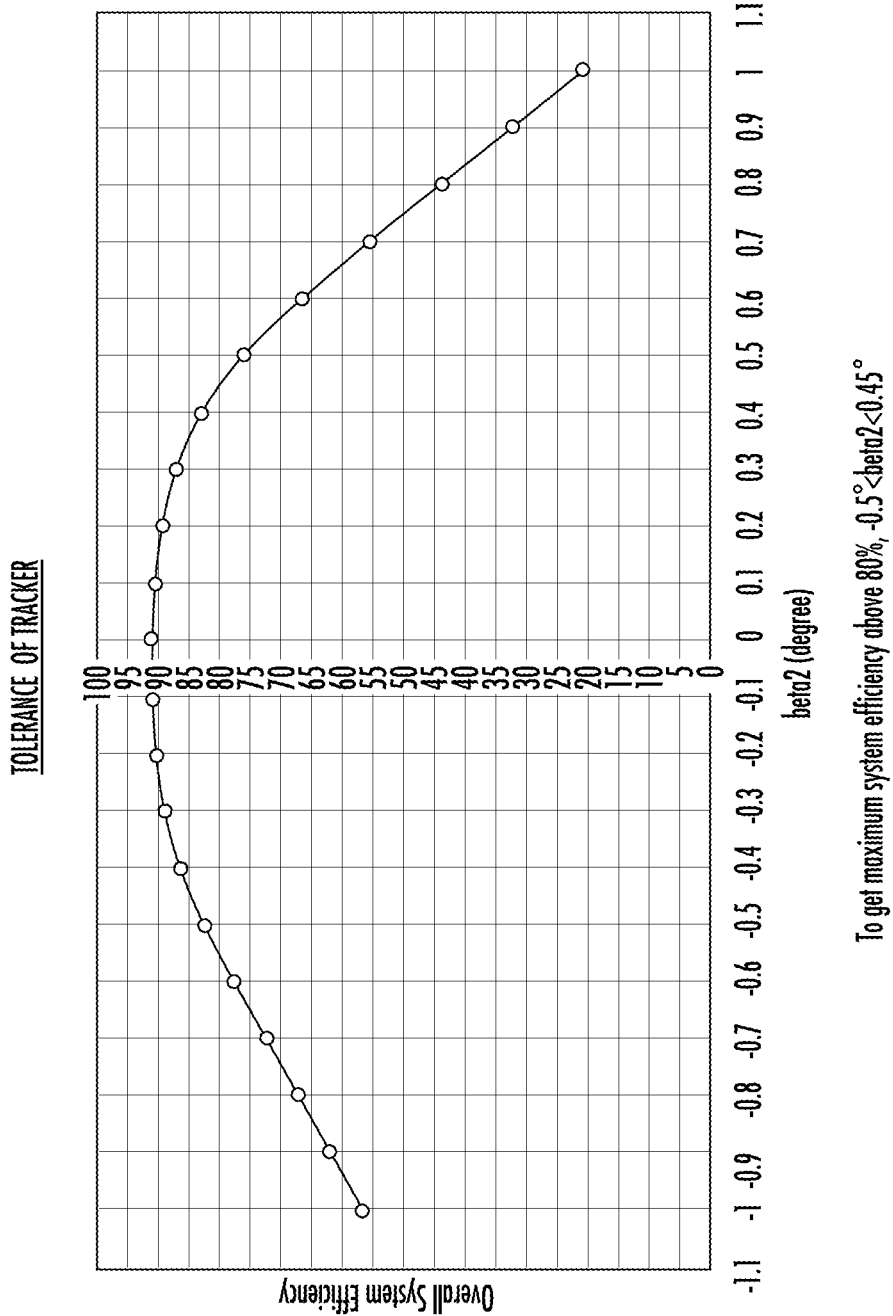
FIG. 15 illustrates the tolerance of the system of FIG. 12 with respect to the specific angle-based error of positioning of the solar tracker mechanism employed for solar tracking.

FIG. 15 illustrates the tolerance (geometrical resilience of the system 1200 of FIG. 12) with respect to the beta-angle based error of positioning of the solar tracker mechanism. Phrased differently, the variable beta2 is a deviation from the normal angle of incidence of light onto the zero-power substrate of the compound lens 1210 in the system 1200, while the overall system efficiency of the plot of FIG. 15 illustrates the throughput efficiency (in %) of the system 1200 as a function of such deviation. It can be seen that the (lens+radiation guide) radiation-concentrator system of the invention is characterized with the angular tolerance between about −0.5 degrees and 0.5 degrees (to maintain the overall efficiency over 80%), which exceeds the typical tolerance range of 0.3 degrees of solar concentrators of related art.

As shown in FIGS. 16A, 16B, the embodiment 1100 of the lightguide can be fabricated with an optional foot-support 1610 of the body 1118 of the lightguide, the dimensions of which are indicated in mm for one implementation. FIG. 17 includes a table summarizing some parameters of the embodiment 1100.

Taking advantage of the moldable silicone-based materials discussed in reference to the implementation of embodiment 100, any embodiment of the lightguide (such as embodiments 500, 1100) can be also rendered from this material in a number of forms suitable for mounting and assembly in different practical use cases. In particular:

One of the considered moldable silicone materials was MS-1001 (Dow Corning).

The proposed lightguide designs provide several advantages over the use of glass-based lightguides for the purposes of concentration of solar energy. Firstly, one preferred material—a flexible silicone based polymer, polydimethylsiloxane (PDMS)—can be molded (which reduces costs of mass production allowing for feasible solar-energy applications). Secondly, the use of silicone-based materials takes advantage of a broadband transmission, which reduces loss due to absorption of sunlight (other polymers such as PMMA or polycarbonate (PC) have poor transmittance in the UV and NIR region, as is well recognized). One silicone-based polymer of choice (see FIG. 4C) has an absorption peak substantially spectrally-coincident with the minimum of the solar irradiance spectrum.

Due to the lower refractive index of this material (as compared to that of glass), Fresnel losses incurred upon the use of an embodiment of the lightguide of the invention are reduced and, therefore, the proposed lightguide possesses a total transmittance of about 93% within the 350 nm-1400 nm spectral range.

The use of injection molding of PDMS can significantly reduce the cost in mass production and no polishing is required compared to conventional glass waveguides. Also noted, the performance discussed above is based on PDMS which has almost same performance as glass.

Due to extremely high flexibility of the moldable silicone, it is possible to design a lightguide s of practically arbitrary shape. Moreover, lightguides may require some supplemental structures to support in assembly. In one implementation, a supporting foot was added below the lightguide to support the lightguide, and the efficiency still remained over 90%. Generally, the entire lightguide can be made in one piece, with no further alignment required, which is difficult for glass, where mounting might be an issue in dense and concentrated solar energy system.

Further, as shown in FIG. 4C, in addition to flexibility of molding, the silicone possesses broadband transmission, especially in the UV and NIR portions of the solar spectrum.

Example 5

Figure 18B:
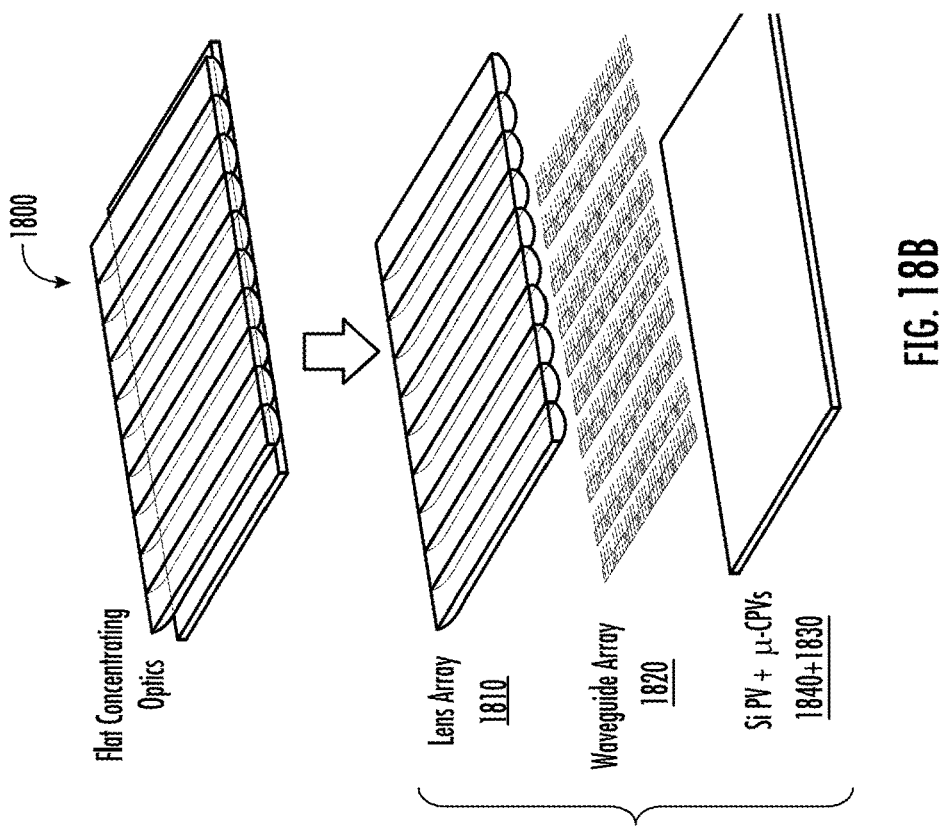
FIG. 18 schematically illustrates an embodiment of the optical system of the invention.
Figure 18A:
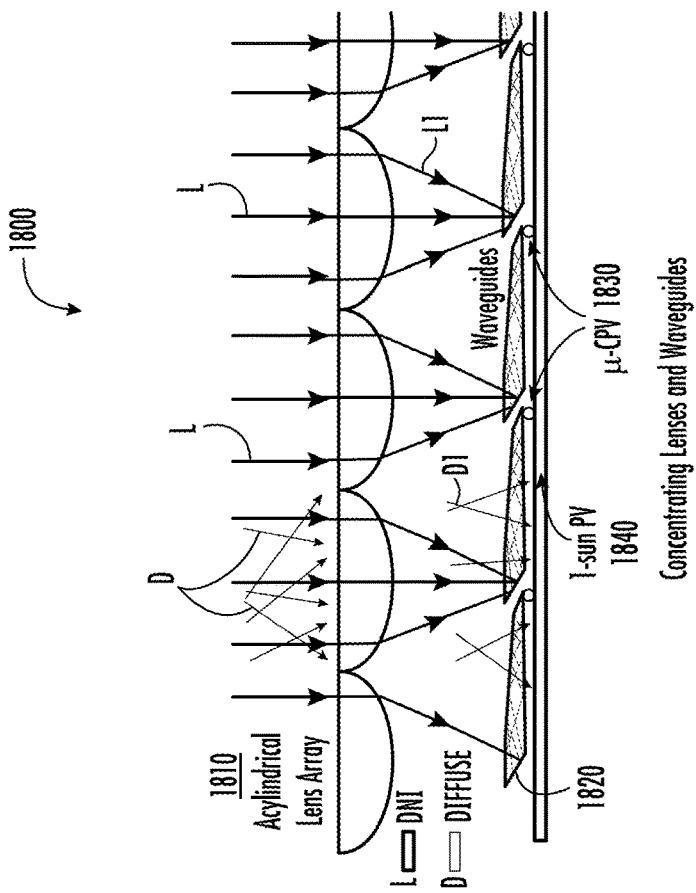

Having discussed structural features and aspects of operation of various optical systems configured, per the idea of the invention, to collect and spatially condense (concentrate) radiative energy (such as solar energy, for example) a comprehensive structure 1800, employing and cooperating the-already-discussed multiple optical systems, is schematically presented in FIGS. 18A and 18B. As shown in FIG. 18A, the system 1800 includes the concatenation of the array 1810 of lenses (which may include an array of compound lenses 100, for example), an array 1820 of lightguides (which may, depending on the specific implementation, lightguides 500 and/or 1100), the multiplicity of micro-CPV cells 1830 (each of which is cooperated with the corresponding output facet of one of the lightguides 1820, as discussed above), and at least macro-sized PV cell 1840 disposed substantially along the plane of the array 1810. In this specific embodiment, different lenses of the array 1810 share the same mechanically-supporting substrate (shown in embodiment of FIGS. 1A, 1B as 110). That is, the transverse dimensions of the substrate 110 are substantially matched with the transverse dimensions of the multiplicity of the lenses of the array 1810. It will be readily appreciated by a skilled person, a linear acylindrical lense of the array 1810 has a radius of its output surface that changes as a function of angle at which such surface is viewed from a center of curvature of this surface in a cross-sectional plane containing the radius The light incident onto the front surfaces of the substrates 110 of the lenses 110 substantially normally (or, at least within such angular bandwidth of the lenses that would uniquely translate into an input angular bandwidth of the lightguides from the array 1820) is denoted as L, while light incident at other angles (such as diffused light) is denoted as D. As has been already alluded to, a given lens of the array 1810 transmits light L and couples is through a corresponding input facet of the corresponding lightguide of the array 1820 to be channeled through the lightguides towards the corresponding micro-CPV cell 1830, to convert light delivered to the output facets of the lightguides and emitted from these facets to electricity. Light D (incident onto the array 1810 at angles outside of the angular bandwidth that allows the coupling into the lightguides of the array 1820) is at least partially transmitted through both the lenses of the array 1810 and the lightguides of the array 1820, and at least partially captured by the PV-cell(s) 1840 to convert this diffused light to electricity. FIG. 18B shows, in a perspective view, the system 1800 in two views. It was empirically determined that optical transmittance of the combination of a lens from the array 1810 and a lightguide from the array 1820 exceeded 80% substantially at each of wavelengths within a spectral range from about 350 nm to about 1400 nm. It is understood that irradiance (spatial density) of radiation (or light) delivered to the output facet of any given lightguide through the body of the lightguide is higher than the irradiance (spatial density) of light channeled through the body of such lightguide.

Therefore, an embodiment of the invention provides a radiation concentrator that includes a lens system and a first radiation guide. The lens system includes a first lens element transparent to radiation and made of a first material and having a first axis and first and second surfaces transverse to the first axis, and a first substrate transparent to radiation and made of a second material that differs from the first material and affixed to the first surface to form a first interface between the first substrate and the first lens element. The first radiation guide has input and output facets that are transverse to one another (the input facet oriented to cross the first axis), and a tapered body bound by a top surface, a bottom surface, and two wall surfaces. Here, a separation between the two wall surfaces in a plane parallel to the bottom surface is monotonically increased as a function of distance from the output surface. A method for use of such radiation concentrator includes a) a step of transmitting radiation through a first substrate of a lens system, through an interface between the first substrate and a first lens element of the lens system, and through the first lens element to form spatially-converging radiation; b) a step of receiving the spatially-converging radiation by a first radiation guide through an input facet to form coupled radiation inside the first radiation guide; and c) a step of channeling the coupled radiation inside a tapered body of the first radiation guide towards an output facet thereof to form an output radiation at the output facet, the output facet being transverse to the input facet.

Overall, therefore, an embodiment of the radiation concentrator invention includes an acylindrical lens array and a lightguide array. (When the radiation concentrator embodiment is complemented with the CPV-cell panels, to turn the concentrator to the solar power converter system, such panels are oriented as shown in FIG. 18. Design and simulation of silicone-based acylindrical lens arrays and waveguides for the freeform solar concentrator were performed using LightTools ray-tracing software. The light source was defined by the standard Air Mass (AM 1.5) solar spectrum. The material for the lens array and waveguide was selected to be MS-1001 or MS-1002 (Dow Corning, the North American version of MS-1001) which has 1.41 refractive index and approximately 96% internal transmission over the solar spectrum. The lens array was designed with an acylindrical structure, a linear lens analogous to an aspherical lens in one dimension. These lenses have higher concentration and less aberration than traditional spherical lenses (see G. Kweon and C. Kim, "Aspherical lens design by using a numerical analysis," in J. Korean Phys. Soc. 51(1), 93-103, 2007). The final structure of the lens array includes a glass slab attached to the back side of the lens, which acts as back support providing the strength to maintain the shape of the silicone lens in practical applications. Furthermore, an anti-reflection coating (ARC) over the solar spectrum was applied to the glass slab to significantly reduce the Fresnel loss at air/glass interface. The size of lens array was 160×160 $mm_2$ with 8 lenses in an array and the designed back focal length was 33.23 mm. Two freeform lightguide designs (wing-like and horn-like, respectively) were optimized, using a reiterative algorithm to maximize optical efficiency and concentration. In particular, the 18-mm long and 4.45-mm wide lightguide, configured to operate based on total internal reflection of light, were tapered down to redirect and further concentrate the sunlight focused on the input facets of the lightguides by the acylindrical lens arrays. For these lightguide, in the lateral plane (parallel to the plane in which the acylindrical lenses rest) a compound parabolic concentrator (CPC) geometry was utilized to focus the light. In one implementation, the CPC structure was 4.45 mm in width and had a 7.9° acceptance angle. As a result, such design enabled the light to be concentrated onto 0.7×0.7 $mm^2$ output facets (to which the CPV cell(s) can be attached to convert the radiation concentrators to radiation power converters). The angle of the taper was optimized to obtain high lightguide efficiency as well as high mechanical strength. At the input of the lightguide, the angle of the reflecting facet depends on the critical angle of material (45.17° for the MS-1002 material). The wing-type lightguide has one auxiliary reflecting facet which is easier to fabricate, while the horn-type lightguide has two consecutive reflecting facets (oriented to provide for TIR of broadband radiation) to redirect the radiation (light) from propagating along one axis (vertical in Figures) to another that is substantially perpendicular (horizontal in Figures) more gradually. This structure allows, in practice, for better Sub-tracking tolerances. Near 94% simulated lightguide efficiency was achieved by optimization of the shape of the freeform lightguides. The combination of an acylindrical lens and a lightguide of either design (wing- or horn-) can achieve up to 160× concentration of radiation.

The use of the moldable silicone-based material also reduced the cost of manufacture and mass production, especially for complicated designs. Besides the improvement of performance, the moldability of silicone also facilitated the inclusion of holding/alignment features to and with the lightguide body in one piece while preserving the total internal reflection condition for practical assembly (which, as known in related art, is difficult to achieve with glass materials). The position of the approximately 2×2×3 mm$^3$ cuboid foot or support of the lightguide was chosen to have minimum impact on the lightguide radiation-concentration efficiency (the reduction of which was determined to be less than 0.5% in the presence of the lightguide foot). Moreover, silicone itself can work as a perfect index-matching adhesive at the interface between the waveguide and the CPV cell for assembly.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes. In some specific cases, which are within the scope of the invention, the terms "approximately" and "about", when used in reference to a numerical value, represent a range of plus or minus 20% with respect to the specified value, more preferably plus or minus 10%, even more preferably plus or minus 5%, most preferably plus or minus 2% with respect to the specified value.

References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

The invention as recited in claims appended to this disclosure is intended to be assessed in light of the disclosure as a whole, including features disclosed in prior art to which reference is made.

While the invention is described through the above-described exemplary embodiments, it will be understood by those of ordinary skill in the art that modifications to, and variations of, the illustrated embodiments may be made without departing from the inventive concepts disclosed herein. For example, while the surfaces that bound the support plate 110 of an embodiment of the lens and the non-parabolic surfaces that limit an embodiment of a lightguide of the system of the invention have been described a being generally planar, it is appreciated that at least one of these surfaces may be appropriately curved to as a non-zero optical power to a corresponding optical component. Disclosed aspects, or portions of these aspects, may be combined in ways not listed above. In another example, the implementation of the embodiment 1800 may include constituent lenses, in the lens array 1810, the optical axes of which are not parallel to one another. Furthermore, a skilled artisan will readily appreciate that, while a substantial portion of the discussion below is presented with examples pertaining to light and/or optical power concentration and/or conversion, the disclosed embodiment are generally applicable to effectuate the spatial concentration of radiative power (radiation) in general. Accordingly, light/optical power/lightguide and similar concepts used herein for describing the examples of implementation of the idea of the invention are but subsets of radiation/radiative power/radiation guide to which implementations of the invention are directed. Therefore, concentrators of radiation and systems for conversion of spatially-concentrated radiation into electricity in general are within the scope of the invention. In another example of a related embodiment, the curvatures of constituent lens elements of the lens array employed in a radiation concentrator of the invention may be different (that is, the constituent lens elements may have different optical powers) and/or their optical axes may be not parallel to one another. Furthermore, it was empirically discovered that the same silicone material(s) employed for fabrication of optical components of the discussed systems (for example, a light-guide radiation concentrator) could be configured as an adhesive or glue between the output facet of the lightguide, for example, and the size matched PV-cell attached to this output surface, to achieve a substantially ideal index-matching at the lightguide/CPV-cell interface. In this case, an embodiment of a solar power converter can be formed that includes a radiation concentrator sub-system containing a radiation-guide-based concentrator and a photovoltaic cell dimensioned to substantially match an area of an output facet of the radiation-guide-based concentrator and adhered to this output facet with the same material from which the output facet is made.

Accordingly, the invention should not be viewed as being limited to the disclosed embodiment(s).

What is claimed is:

1. A radiation concentrator comprising:
   a lens system including
      a first lens element transparent to first radiation and made of a first material and having a first axis and first and second surfaces transverse to the first axis; and
      a first substrate transparent to first radiation and made of a second material and affixed to the first surface to form a first interface between the first substrate and the first lens element,
   a first radiation guide having
      input and output facets that are transverse to one another, the input facet disposed to cross the first axis,
      and
      a tapered body bound by a top surface, a bottom surface, and two wall surfaces,
         wherein a separation between the two wall surfaces in a plane containing the bottom surface is monotonically increased as a function of distance from the output surface.

2. The radiation concentrator according to claim 1, wherein the first radiation guide further includes an auxiliary facet located to provide for a total internal reflection of radiation that has entered the first radiation guide through the input facet and to redirect said entered radiation towards the output facet.

3. The radiation concentrator according to claim 1, wherein planes in which the input and output facet lie are not perpendicular to one another.

4. The radiation concentrator according to claim 1, wherein the first radiation guide comprises a first portion between the input facet and the body, said first portion having a first portion axis that is perpendicular to the input facet, said first portion having a cross-section that monotonically decreases with a distance measured along the first portion axis from the input facet, the first portion having two side walls each of which is transverse to the first portion axis.

5. The radiation concentrator according to claim 1, wherein the first radiation includes light, the lens system has a first transmittance value exceeding 85% and the first radiation guide has a second transmittance value exceeding 80% substantially at each of the wavelengths within a spectral range from about 350 nm to about 1400 nm.

6. The radiation concentrator according to claim 1,
   wherein the lens system and the first radiation guide are spatially configured such that the input facet is located substantially at a focal plane of the first lens element, and
   wherein the bottom surface and the first substrate are substantially parallel to one another.

7. The radiation concentrator according to claim 6, wherein the first lens element is a linear acylindrical lens, the first substrate has a substantially zero power, and the first interface does not include an adhesive material.

8. The radiation concentrator according to claim 6, wherein at least one of the following conditions is satisfied:
   a) the first substrate of the lens system is dimensioned as a plane-parallel plate or a wedge;
   b) the lens system comprises
      a second lens element made of the first material and having a second axis and third and fourth surfaces transverse to said second axis, and
      a second substrate transparent to said first radiation and made of the second material and affixed to the third surface to form a second interface between the second substrate and the second lens element,
   and
      the radiation concentrator further comprises a second radiation guide that is substantially identical to the first radiation guide and that is spatially cooperated with the second lens such that an input facet of the second lightguide is located substantially at a focal plane of the second lens element and a bottom surface of the second lightguide and the substrate are substantially parallel to one another;
   and
   c) a cross-sectional profile of at least one of the two walls in a plane transverse to said at least one of the two walls is substantially parabolic.

9. The radiation concentrator according to claim 8, wherein the second substrate is the first substrate affixed to the third surface to form said second interface that is devoid of an adhesive material.

10. The radiation concentrator according to claim 6, wherein the first and second axes are not parallel to one another.

11. The radiation concentrator according to claim 8, wherein at least one of the second and fourth surfaces is a curved surface a radius of which changes as a function of angle at which such surface is viewed from a center of curvature of the surface in a cross-sectional plane containing the radius.

12. A solar power converter comprising the radiation concentrator according to claim 8, and further comprising a first photovoltaic cell dimensioned to substantially match an area of an output facet of any of the first and second radiation guides and cooperated with said output facet to collect radiation emitted through said output facet.

13. A solar power converter comprising the radiation concentrator according to claim 12, and further comprising a second photovoltaic cell disposed substantially parallel to the bottom surface of the first radiation guide and separated from the first lens element by the first radiation guide.

* * * * *